US012367818B2

(12) United States Patent
Lai et al.

(10) Patent No.: US 12,367,818 B2

(45) Date of Patent: Jul. 22, 2025

(54) DISPLAY PANEL AND DISPLAY DEVICE

(71) Applicant: Xiamen Tianma Display Technology Co., Ltd., Xiamen (CN)

(72) Inventors: Qingjun Lai, Xiamen (CN); Chengxu Li, Xiamen (CN); Xiangyuan Li, Xiamen (CN); Jinjin Yang, Xiamen (CN); Yong Yuan, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/786,126

(22) Filed: Jul. 26, 2024

(65) Prior Publication Data

US 2024/0386840 A1 Nov. 21, 2024

(30) Foreign Application Priority Data

Jul. 28, 2023 (CN) ........................ 202310942648.X

(51) Int. Cl.

| | |
|---|---|
| ***G11C 19/00*** | (2006.01) |
| ***G09G 3/32*** | (2016.01) |
| ***G11C 19/28*** | (2006.01) |

(52) U.S. Cl.

CPC ............. *G09G 3/32* (2013.01); *G11C 19/287* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2320/02* (2013.01); *G09G 2320/0613* (2013.01); *G09G 2330/021* (2013.01); *G09G 2340/0435* (2013.01)

(58) Field of Classification Search

CPC ............. G09G 3/32; G09G 2300/0819; G09G 2300/0842; G09G 2300/0861; G09G 2310/0286; G09G 2310/08; G09G 2320/02; G09G 2320/0613; G09G 2330/021; G09G 2340/0435; G09G 3/20; G09G 3/3266; G09G 3/3677; G09G 2300/0426; G11C 19/287; G11C 19/28

See application file for complete search history.

(56) References Cited

U.S. PATENT DOCUMENTS

| | | | | |
|---|---|---|---|---|
| 11,862,065 | B2 * | 1/2024 | Li | G09G 3/2096 |
| 2010/0150302 | A1 * | 6/2010 | Tsai | G11C 19/28 377/79 |
| 2018/0336957 | A1 * | 11/2018 | Mi | G09G 3/20 |
| 2021/0035516 | A1 * | 2/2021 | Cao | G11C 19/287 |
| 2022/0036788 | A1 * | 2/2022 | Shi | G09G 3/20 |

* cited by examiner

*Primary Examiner* — Pegeman Karimi

(74) *Attorney, Agent, or Firm* — KDW FIRM PLLC

(57) ABSTRACT

A display panel includes a driver circuit including shift registers with N stages and being cascade with each other, where N≥2, and each shift register includes a first control portion and a second control portion. The first control portion is configured to control a first output signal, where the first output signal of an i-th stage of shift register is an input signal of a j-th stage of shift register, and 1≤i≤N, 1≤j≤N. The second control portion is configured to receive at least the first output signal and a frequency control signal and control a second output signal. In a case where the first output signal is an effective pulse and a time period of the effective pulse is within a time period of an effective pulse of the frequency control signal, the second output signal is the effective pulse.

20 Claims, 20 Drawing Sheets

DISPLAY PANEL AND DISPLAY DEVICE

CROSS-REFERENCE TO RELATED APPLICATION(S)

This application claims priority to Chinese Patent Application No. 202310942648.X filed Jul. 28, 2023, the disclosure of which is incorporated herein by reference in its entirety.

TECHNICAL FIELD

Embodiments of the present disclosure relate to the field of display technologies, and in particular to, a display panel and a display device.

BACKGROUND

With the continuous development of display technologies, more and more electronic apparatuses with display functions are widely applied to daily life and working of people, which brings great convenience to the daily life and working of people.

The main component implementing the display function of the electronic apparatuses is a display panel. A scan driver circuit in the display panel outputs a drive signal, and the drive signal is transmitted to a pixel circuit in a pixel array by using a signal line such as a gate line, so that the pixel array may be controlled to display a picture. However, in the conventional scan driver circuit, an abnormal drive signal is provided to a part of pixel circuits in a drive process, which may cause the part of pixel circuits to fail to work normally, thereby resulting in the abnormal display in a part of regions.

SUMMARY

The present disclosure provides a display panel and a display device.

In a first aspect, an embodiment of the present disclosure provides a display panel. The display panel includes a driver circuit including shift registers with N stages and being cascade with each other, where $N \geq 2$, and each of the shift registers includes a first control portion and a second control portion. The first control portion is configured to control a first output signal, where the first output signal of an i-th stage of shift register is an input signal of a j-th stage of shift register, and $1 \leq i \leq N$, $1 \leq j \leq N$. The second control portion is configured to receive at least the first output signal and a frequency control signal and control a second output signal. In a case where the first output signal is an effective pulse and a time period of the effective pulse is within a time period of an effective pulse of the frequency control signal, the second output signal is an effective pulse.

In a second aspect, an embodiment of the present disclosure further provides a display device including the display panel of any one of the first aspect.

DETAILED DESCRIPTION

Figure 1:
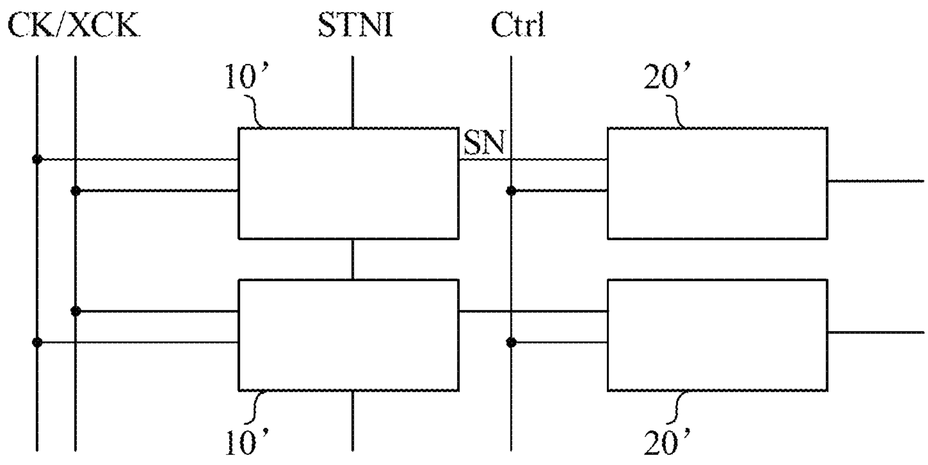
FIG. 1 is a driver circuit in the related art.

The present disclosure is further described hereinafter in detail in conjunction with drawings and embodiments. It should be understood that the embodiments described herein are intended to explain the present disclosure and not to limit the present disclosure. Additionally, it should be noted that for ease of description, only part, not all, of the structures related to the present disclosure are shown in the drawings.

Terms used in the embodiments of the present disclosure are merely used for describing specific embodiments and are not intended to limit the present disclosure. It should be noted that the nouns of locality such as “on”, “below”, “left” and “right” described in the embodiments of the present disclosure are described from the perspective of the drawings, and should not be understood as limiting the embodiments of the present disclosure. In addition, in this context, it should also be understood that when an element is formed “on” or “below” another element, it may not only be directly formed “on” or “below” another element, and may also be indirectly formed “on” or “below” another element through an intervening element. The terms “first”, “second” and the like are used for description only, and do not represent any order, quantity, or importance, but only used for distinguishing different components. For those of ordinary skilled in the art, the specific meanings of the above terms in the present disclosure may be understood according to specific situations.

As used herein, the term "include" and its variants are open inclusive, that is, "including, but not limited to". The term "based on" is "based at least in part on". The term "one embodiment" represents "at least one embodiment".

It should be noted that the terms "first", "second" and the like mentioned in the present disclosure are only used for distinguishing the corresponding contents, and are not used for limiting the order or interdependence relationship.

It should be noted that references to "one" or "more" modification(s) mentioned in the present disclosure are intended to be illustrative rather than limiting and that those skilled in the art should be understood that reference to "one or more" unless the context clearly indicates otherwise.

Figure 2:
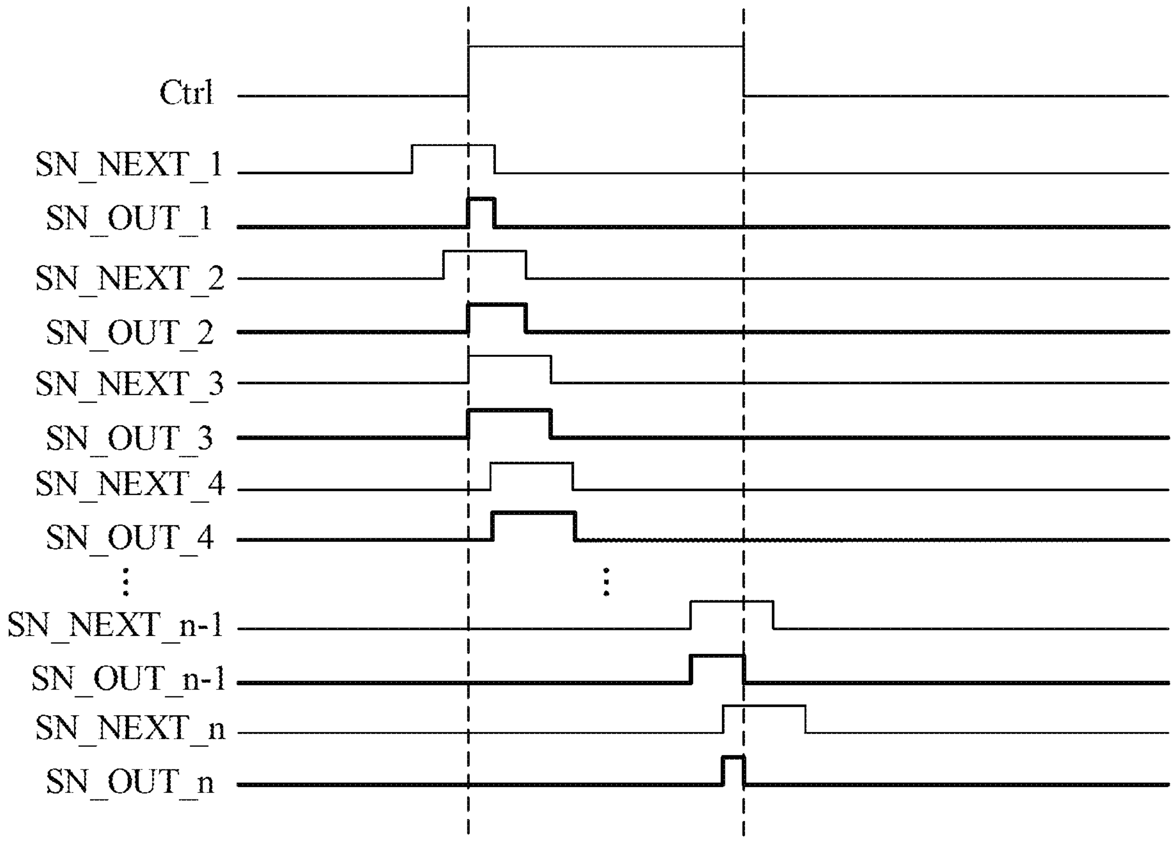
FIG. 2 is a drive timing diagram of the driver circuit shown in FIG. 1.

FIG. 1 is a driver circuit in the related art, and FIG. 2 is a drive timing diagram of the driver circuit shown in FIG. 1. Referring to FIGS. 1 and 2, a conventional driver circuit is provided with shift register circuits 10' of multiple stages and being cascaded with each other, and moreover, a gating circuit 20' is also provided for each stage of shift register circuit. The shift register circuit 10' is responsible for outputting each stage of scan pulse signal SN, and the gating circuit 20' is correspondingly connected to an output terminal of the shift register circuit 10, is configured to receive the scan pulse signal SN, so that the scan pulse signal SN is allowed to be output only at an effective stage of the control signal Ctrl under the control of the control signal Ctrl. Thus, the output frequency control of the scan pulse signal SN can be achieved through the control signal Ctrl so as to change the refresh frequency of the display panel and adapt to different display scenes.

However, since the scan pulse signal SN and the control signal Ctrl output by each stage of shift register circuit are two uncorrelated, independent signals. Scan pulse signals SN_NEXT_1, SN_NEXT_2, SN_NEXT_n−1, and SN_NEXT_n of a 1st stage, a 2nd stage, an (n−1)-th stage, and an n-th stage of shift register circuits 10' shown in FIG. 2 may have a part of scan pulse signals SN, and an effective pulse (exemplified as high level) of the part of scan pulse signals SN just crosses both the effective stage (exemplified as high level) and an ineffective stage (exemplified as low level) of the control signal Ctrl. In other words, a part of time periods of their effective pulses (high level) may be located in the ineffective stage (low level) of the control signal Ctrl, thereby causing this part of effective pulses to be unable to be output due to being in the ineffective stage of the control signal Ctrl, so that the scan pulse signal SN is truncated by the control signal Ctrl and cannot be output completely, thereby forming the abnormal output signal, that is, output signals SN_OUT_1, SN_OUT_2, SN_OUT_n−1, and SN_OUT_n of the 1st stage, the 2nd stage, the (n−1)-th stage, and the n-th stage of shift register circuits 10' shown in FIG. 2 are all incomplete effective pulses. It should be understood that after the incomplete pulse signal is output to a corresponding pixel circuit, the pixel circuit will not work properly, thereby resulting in the abnormal display in a part of regions of a display screen.

Based on the above-described technical problems, an embodiment of the present disclosure provides a display panel. The display panel includes a driver circuit including shift registers with N stages and being cascade with each other, where N≥2, and each of the shift registers includes a first control portion and a second control portion. The first control portion is configured to control a first output signal, where the first output signal of an i-th stage of shift register is an input signal of a j-th stage of shift register, and 1≤i≤N, 1≤j≤N. The second control portion is configured to receive at least the first output signal and a frequency control signal and control a second output signal. In a case where the first output signal is an effective pulse and a time period of the effective pulse of the first output signal is within a time period of an effective pulse of the frequency control signal, the second output signal is an effective pulse.

In the above-described technical schemes, the first control portion and the second control portion are disposed in the shift register, the first output signal is controlled by the first control portion, and the first output signal of the i-th stage of shift register is the input signal of the j-th stage of shift register, so that the cascade of at least two stages of first control portions can be achieved. Moreover, the second control portion is configured to receive at least the first output signal and the frequency control signal, and control the second output signal being an effective pulse in a case where the first output signal is the effective pulse and the time period of the effective pulse is within the time period of the effective pulse of the frequency control signal, so that at least when the time period of the effective pulse of the first output signal is within the time period of the effective pulse of the frequency control signal, the second output signal is ensured to output a complete effective pulse, whereby a case where the second output signal outputs the incomplete pulse signal is avoided, the pixel circuit can always receive the normal drive signal, the normal working of the pixel circuit is ensured, and thus the normal picture is displayed.

The above is the core idea of the present disclosure, and the technical schemes of the embodiments of the present disclosure will be described clearly and completely in connection with the accompanying drawings in the embodiments of the present disclosure below. All other embodiments obtained by those of ordinary skill in the art based on the embodiments of the present disclosure without requiring creative efforts shall all fall in the scope of protection of the present disclosure.

Figure 3:
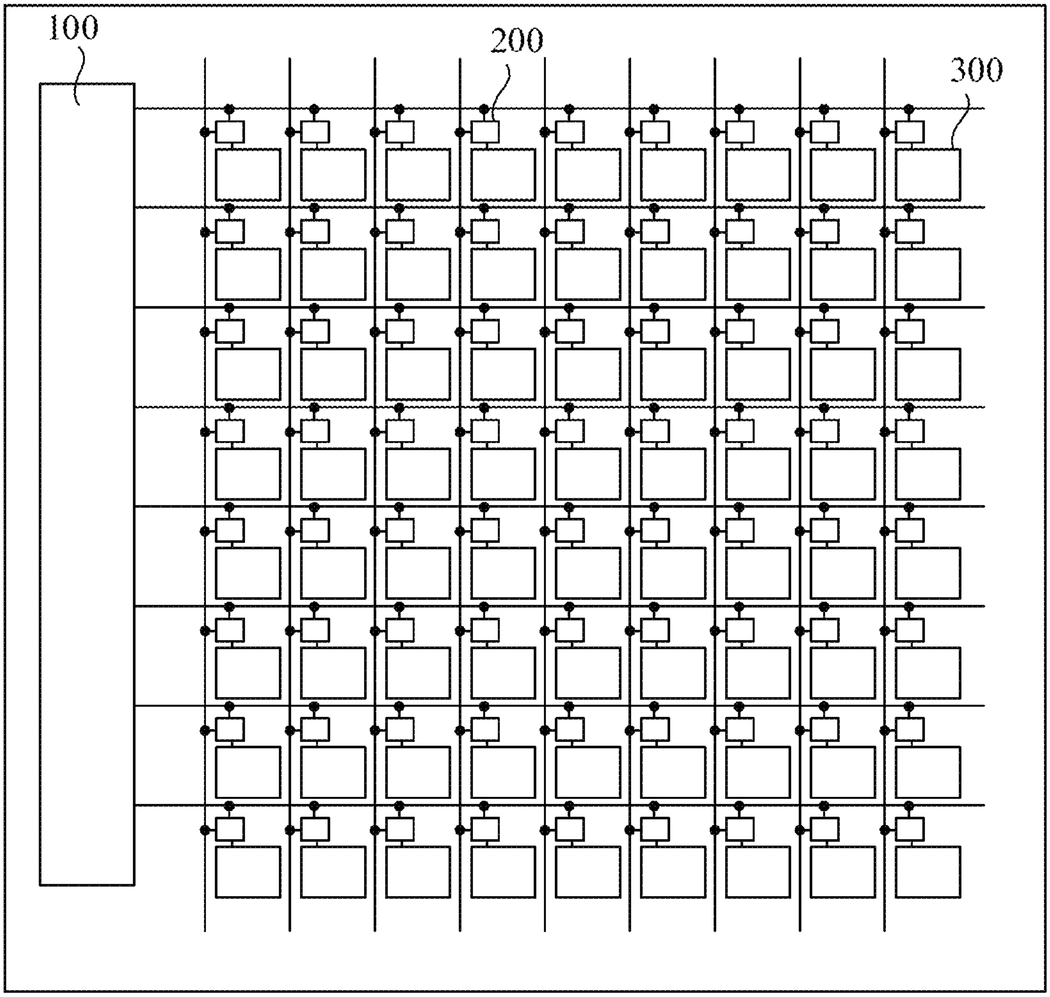
FIG. 3 is a schematic structural diagram of a display panel according to an embodiment of the present disclosure.
Figure 4:
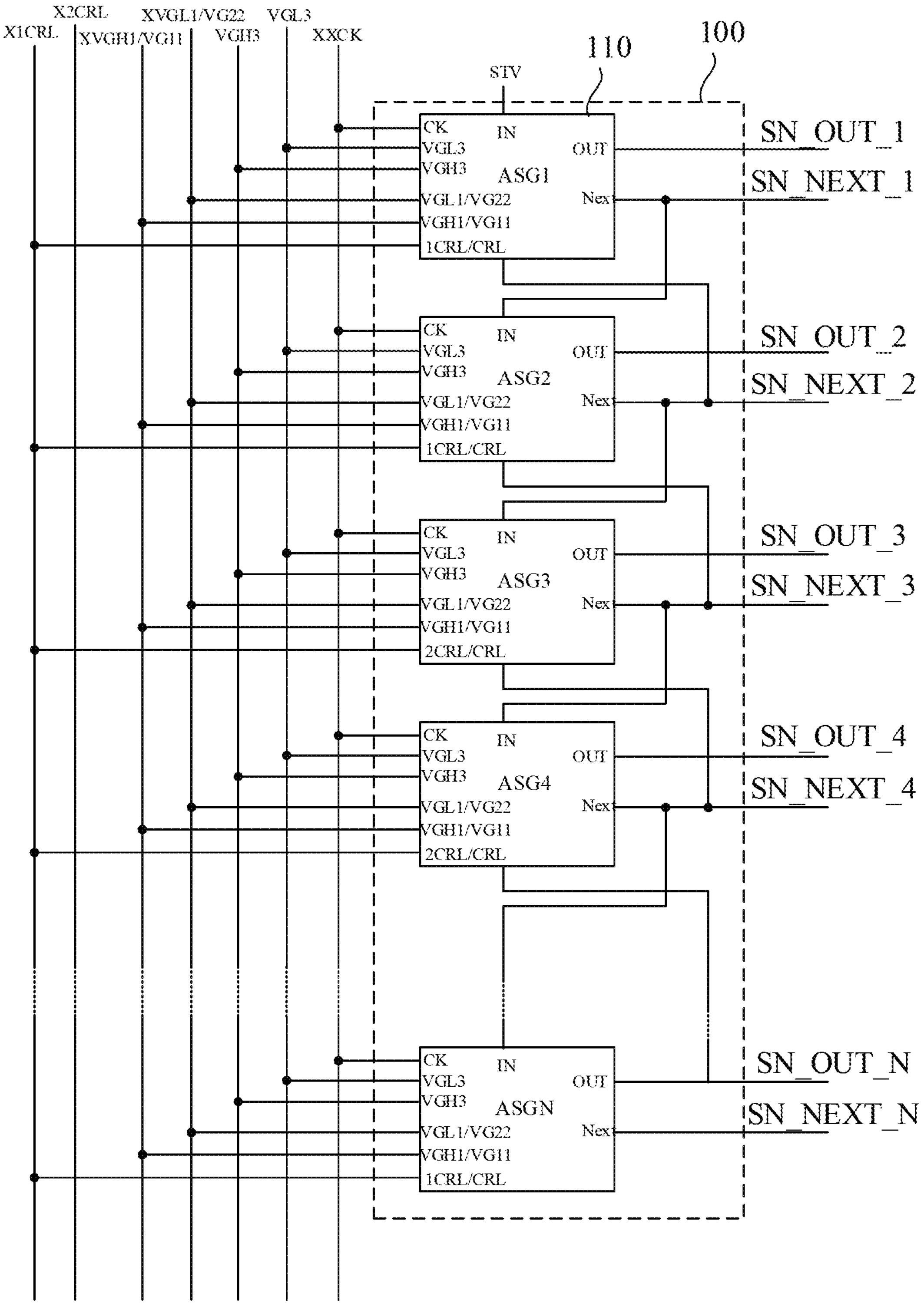
FIG. 4 is a schematic structural diagram of a driver circuit in the display panel shown in FIG. 3.
Figure 5:
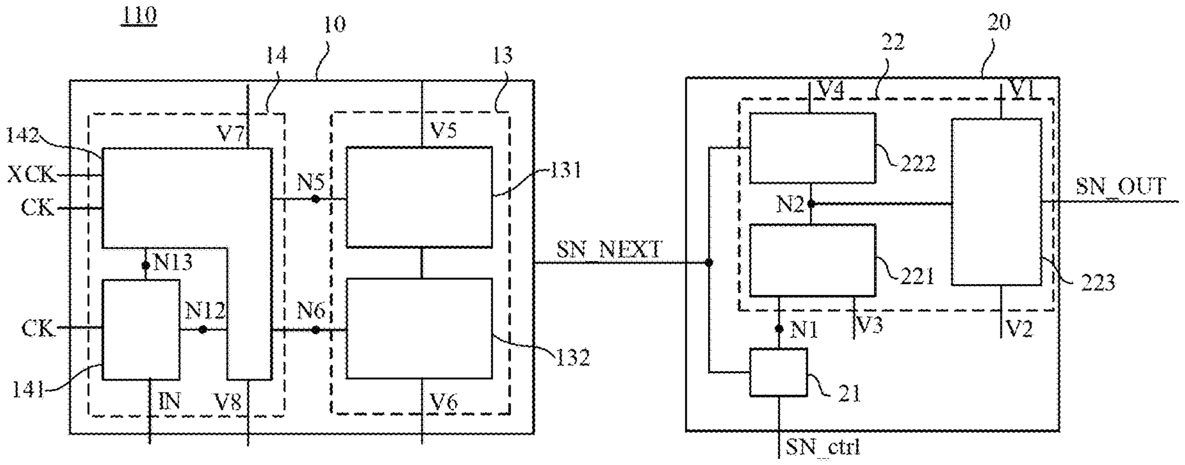
FIG. 5 is a schematic structural diagram of a shift register in the driver circuit shown in FIG. 4.
Figure 6:
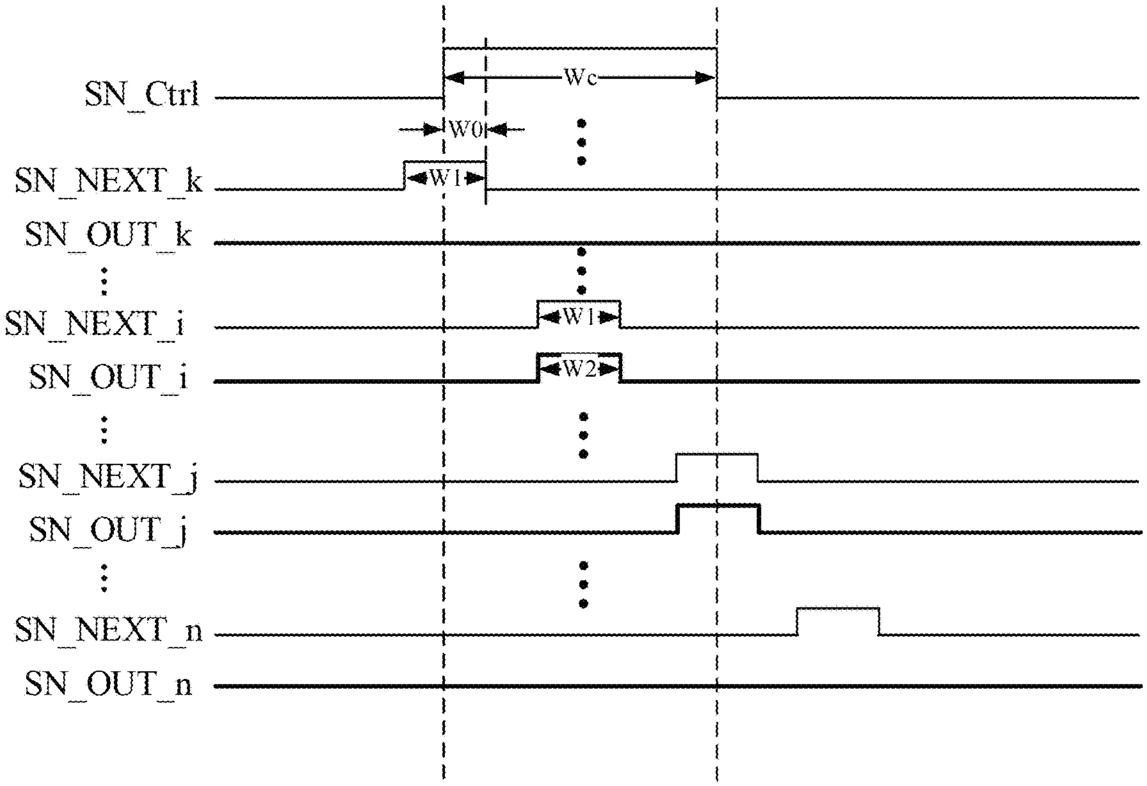
FIG. 6 is a drive timing diagram of each stage shift register in the driver circuit shown in FIG. 4.

FIG. 3 is a schematic structural diagram of a display panel according to an embodiment of the present disclosure, FIG. 4 is a schematic structural diagram of a driver circuit in the display panel shown in FIG. 3, FIG. 5 is a schematic structural diagram of a shift register in the driver circuit shown in FIG. 4, and FIG. 6 is a drive timing diagram of each stage shift register in the driver circuit shown in FIG. 4. Referring to FIGS. 3 to 6, the display panel includes a driver circuit 100 including shift registers with N stages and being cascade with each other, where N≥2, and each of the shift registers 110 includes a first control portion 10 and a second control portion 20. The first control portion 10 is configured to control a first output signal SN_NEXT, where the first output signal SN_NEXT of an i-th stage of shift register is an input signal of a j-th stage of shift register 110, and 1≤i≤N, 1≤j≤N. The second control portion 20 is configured to receive at least the first output signal SN_NEXT and a frequency control signal SN_ctrl, and control a second output signal SN_OUT. In a case where the first output signal SN_NEXT is an effective pulse and a time period of the effective pulse is within a time period of an effective pulse of the frequency control signal SN_ctrl, the second output signal SN_OUT is an effective pulse.

As can be seen from FIGS. 3 and 4, at least two stages of shift registers 110 are disposed in the driver circuit 100 of the display panel, and the shift register 110 of at least two stages is cascaded, that is, an output signal of the shift register 110 of a certain stage is an input signal of a following certain stage of the shift register 110. Exemplarily, an output signal of adjacent previous stage of shift register 110 is illustrated in FIG. 4 as an input signal of a next stage of shift register 110. In the embodiments of the present disclosure, the shift register 110 is provided with a first control portion 10 and a second control portion 20, where the first control portion 10 in each stage of the shift register 110 actually forms the above-described cascade relationship, that is, the first output signal SN_NEXT output by the first control portion 10 in a certain stage of shift register 110 is an input signal of the first control portion 10 in the following certain stage of shift register 110. For the second control portion 20 in each stage of shift register 110, gating is controlled by an additional input frequency control signal SN_ctrl so as to control whether the first output signal SN_NEXT provided by the first control portion 10 is output, thereby forming a second output signal SN_OUT.

Firstly, it should be noted that an effective pulse of the first output signal SN_NEXT, an effective pulse of the second output signal SN_OUT, and an effective pulse of the frequency control signal SN_ctrl shown in FIG. 6 are all exemplified as high levels, and an ineffective pulse of the first output signal SN_NEXT, an ineffective pulse of the second output signal SN_OUT, and an ineffective pulse of the frequency control signal SN_ctrl shown in FIG. 6 are all exemplified as low levels. Specifically, as shown in FIG. 6, the first output signal SN_NEXT_i of the i-th stage of shift register is used as an example, in the embodiments of the present disclosure, according to the frequency control signal SN_ctrl and the second control portion 20, the second control portion 20 are responsible for outputting an effective pulse when the first output signal SN_NEXT is the effective pulse and the time period of the effective pulse is within a time period of the effective pulse of the frequency control signal SN_ctrl, thereby forming the second output signal SN_OUT. In a more convenient manner to understand, in the embodiments of the present disclosure, according to the frequency control signal SN_ctrl and the second control portion 20, the second control portion 20 are responsible for controlling to output those effective pulses of the first output signal SN_NEXT when time periods of those effective pulses of the first output signal SN_NEXT are completely within a time period of the effective pulse of the frequency control signal SN_ctrl, thereby forming the second output signal SN_OUT. More specifically, it should be understood that when an effective pulse of the first output signal SN_NEXT is completely covered by the effective pulse of the frequency control signal SN_ctrl, the second control portion 20 is configured to output the effective pulse of the first output signal SN_NEXT completely covered by the effective pulse of the frequency control signal SN_ctrl. Thus, according to the embodiments of the present disclosure, the second control portion 20 and the frequency control signal SN_ctrl are configured so that at least when the time period of the effective pulse of the first output signal is within the time period of the effective pulse of the frequency control signal, the second output signal is ensured to output the complete effective pulse, whereby a case where the second output signal outputs the incomplete pulse signal is avoided, the pixel circuit may always receive the normal drive signal, the normal working of the pixel circuit is ensured, and thus the normal picture is displayed.

Further, when the time period of the effective pulse of the first output signal SN_NEXT is within the time period of the effective pulse of the frequency control signal SN_ctrl, a time length of the effective pulse of the first output signal SN_NEXT is W1, and a time length of the effective pulse of the second output signal SN_OUT is W2, where W1=W2.

As described above, when an effective pulse of the first output signal is completely covered by the effective pulse of the frequency control signal SN_ctrl, the second control portion 20 outputs the effective pulse of the first output signal SN_NEXT to form the effective pulse of the second output signal SN_OUT. Therefore, a time length W2 of the effective pulse is kept consistent with a time length W1 of the effective pulse of the first output signal SN_NEXT, that is, W1=W2.

With continued reference to FIG. 6, further, when at least a part of first output signals SN_NEXT is the effective pulse and the time period of the effective pulse partially overlaps with the time period of the effective pulse of the frequency control signal SN_ctrl, the second output signal SN_OUT is an ineffective pulse.

A first output signal SN_NEXT_k of a k-th stage of shift register is used as an example, where $1 \le k < i$, when the time period of the effective pulse of the first output signal SN_NEXT_k overlaps with the time period of the effective pulse of the frequency control signal SN_ctrl, it means that the effective pulse of the first output signal SN_NEXT_k just crosses the effective pulse and the ineffective pulse of the frequency control signal SN_ctrl. In this case, the second control portion 20 and the frequency control signal SN_ctrl in the embodiments of the present disclosure are responsible for not only controlling the effective pulse of the first output signal SN_NEXT to be output when the effective pulse of the first output signal SN_NEXT is completely covered by the effective pulse of the frequency control signal SN_ctrl but also controlling the effective pulse of the first output signal SN_NEXT_j not to be output, that is, the second output signal SN_OUT may be caused to output the ineffective pulse. Thus, the second control unit described above may substantially limit the incomplete effective pulse to be output when the effective pulse of a part of first output signals SN_NEXT crosses the effective pulse and the ineffective pulse of the frequency control signal SN_ctrl, thereby contributing to reducing the influence of the incomplete pulse signal on the display.

With continued reference to FIG. 6, still further, when the frequency control signal SN_ctrl is switched from the ineffective pulse to the effective pulse and the first output signal SN_NEXT is the effective pulse, the second output signal SN_OUT is the ineffective pulse. When the frequency control signal SN_ctrl is switched from the effective pulse to the ineffective pulse and the first output signal SN_NEXT is the effective pulse, the second output signal SN_OUT is the effective pulse.

For the first output signal SN_NEXT_k of the k-th shift register of FIG. 6 described above, the time period of the effective pulse of the first output signal SN_NEXT_k overlaps with the time period of the effective pulse of the frequency control signal SN_ctrl, and the frequency control signal SN_ctrl is just switched from the ineffective pulse to the effective pulse, in this case, the second output signal SN_OUT is the ineffective pulse, which avoids outputting the incomplete pulse signal. The first output signal SN_NEXT_j of the j-th stage of shift register of FIG. 6 is continued to be used as an example, the time period of the effective pulse of the first output signal SN_NEXT_j also overlaps with the time period of the effective pulse of the frequency control signal SN_ctrl, and during the time period, the frequency control signal SN_ctrl is just switched from the effective pulse to the ineffective pulse. In this case, the second control unit of the present disclosure may make the effective pulse of the first output signal SN_NEXT_j output completely, and make the second output signal SN_OUT output as the effective pulse. Thus, in the embodiments of the present disclosure, even if the first output signal SN_NEXT partially overlaps with the effective pulse of the frequency control signal SN_ctr, it is possible to ensure that the second output signal SN_OUT is a complete pulse by limiting the effective pulse to be output or control the complete effective pulse to be output, thereby avoiding a case where the effective pulse in the first output signal is truncated by the frequency control signal and the incomplete pulse is output, and preventing the incomplete pulse from affecting the normal working of the pixel circuit and resulting in the abnormal display.

With continued reference to FIG. 6, still further, a time length of the effective pulse of the first output signal SN_NEXT is W1, and a time length of the effective pulse of the frequency control signal SN_ctrl is Wc; a time length that a preset effective pulse of the first output signal SN_NEXT overlaps with the effective pulse of the frequency control signal SN_ctrl is W0, where 0<W0<W1; and when the first output signal SN_NEXT is the preset effective pulse, the second output signal SN_OUT is the ineffective pulse.

Here, the preset effective pulse refers to a pulse signal which is present in the first output signal SN_NEXT and partially overlaps with the effective pulse of the frequency control signal SN_ctrl, and the preset effective pulse more refers to an effective pulse in which the frequency control signal SN_ctrl is switched from the ineffective pulse to the effective pulse within the time period. At this time, since the preset effective pulse only partially overlaps with the effective pulse of the frequency control signal SN_ctrl, but not entirely covered by the effective pulse of the frequency control signal SN_ctrl, the overlapping time length W0 is necessarily less than the time length W1 of the complete effective pulse of the preset effective pulse. Similarly, referring to the first output signal SN_NEXT_k of the kth-stage shift register shown in FIG. 6, in this case, it is indicated that the preset effective pulse in the first output signal SN_NEXT actually just crosses the effective pulse and the ineffective pulse of the frequency control signal SN_ctrl. Therefore, the second control portion 20 and the frequency control signal SN_ctrl also function to control not to output the effective pulse of the first output signal SN_NEXT_k, that is, function to cause the second output signal SN_OUT to output the ineffective pulse.

The above-described cases of the effective pulses of the first output signal SN_NEXT are all cases in which the effective pulses of the first output signal SN_NEXT overlap or partially overlap with the effective pulses of the frequency control signal SN_ctrl. With reference to FIG. 6, the first output signal SN_NEXT_n of the n-th shift register is used as an example. When the first output signal SN_NEXT is the effective pulse and the time period of the effective pulse is outside the time period of the effective pulse of the frequency control signal SN_ctrl, the second output signal SN_OUT is the ineffective pulse.

This case is actually a case where the effective pulse of the first output signal SN_NEXT does not overlap with the effective pulse of the frequency control signal SN_ctrl. In this case, the second control portion 20 and the frequency control signal SN_ctrl function to limit the output of the effective pulse of the first output signal SN_NEXT_j, so that the second output signal SN_OUT outputs the ineffective pulse.

It should be noted that FIG. 6 illustrates in fact the drive timing of different stages of shift registers in one data refresh cycle, and that the first output signal SN_NEXT of each stage of shift register is exemplarily only one effective pulse. Apparently, multiple data refresh cycles in succession are present in the actual drive process of the display panel, and each stage of shift register needs to provide or output multiple effective pulses in the multiple data refresh cycles. For the multiple effective pulses provided by each stage of shift register, the shift registers of the embodiments of the present disclosure may implement corresponding output control based on the same principle, and this timing control process is also described below.

Figure 7:
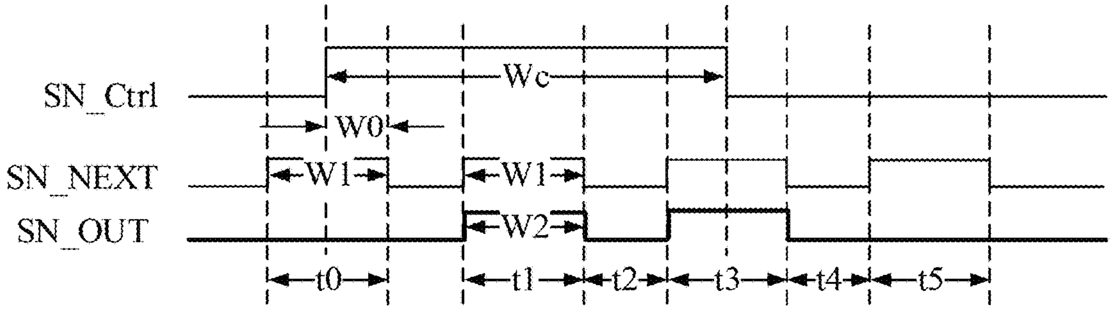
FIG. 7 is another drive timing diagram of a shift register according to an embodiment of the present disclosure.

FIG. 7 is another drive timing diagram of a shift register according to an embodiment of the present disclosure. With reference to FIGS. 3 to 7, the first output signal SN_NEXT has multiple effective pulses. Also, it should be noted that the effective pulse of the first output signal SN_NEXT, the effective pulse of the second output signal SN_OUT, and the effective pulse of the frequency control signal SN_ctrl shown in this drawing are all exemplified as high levels, and the ineffective pulse of the first output signal SN_NEXT, the ineffective pulse of the second output signal SN_OUT, and the ineffective pulse of the frequency control signal SN_ctrl shown in this drawing are all exemplified as low levels.

Based on the same principle, the 2nd effective pulse (corresponding to the first stage t1 in the drawings) of the first output signal SN_NEXT is used as an example, and the time period of the 2nd effective pulse is within the time period of the effective pulse of the frequency control signal SN_ctrl. At this time, the second output signal SN_OUT outputs the effective pulse by the control of the second control portion 20 and the frequency control signal SN_ctrl. Similarly, for the 2nd effective pulse, the time period of the 2nd effective pulse is within the time period of the effective pulse of the frequency control signal SN_ctrl, in this case, a time length W1 of the 2nd effective pulse of the first output signal SN_NEXT is equal to a time length W2 of the effective pulse of the second output signal SN_OUT by the control of the second control portion 20 and the frequency control signal SN_ctrl, that is a, W1=W2.

With continued reference to FIG. 7, the 1st effective pulse (corresponding to the zero stage t0 in the drawings) of the first output signal SN_NEXT is used as an example, the time period of the 1st effective pulse partially overlaps with the time period of the effective pulse of the frequency control signal SN_ctrl, and the frequency control signal SN_ctrl is switched from the ineffective pulse to the effective pulse in the time period of the 1 st effective pulse. At this time, the second output signal SN_OUT outputs the ineffective pulse by the control of the second control portion 20 and the frequency control signal SN_ctrl. Also, for this 1st effective pulse, the frequency control signal SN_ctrl is switched from the ineffective pulse to the effective pulse. At this time, the second output signal SN_OUT outputs the ineffective pulse by the control of the second control portion 20 and the frequency control signal SN_ctrl. Still further, for the 1st effective pulse, the time length of the 1st effective pulse is W1, and the time length of the effective pulse of the frequency control signal SN_ctrl is Wc. The 1st effective pulse is the preset effective pulse of the first output signal SN_NEXT, and a time length that the 1st effective pulse overlaps with the effective pulse of the frequency control signal SN_ctrl is W0, 0<W0<W1. In this case, by the control of the second control portion 20 and the frequency control signal SN_ctrl, when the first output signal SN_NEXT is the preset effective pulse, the second output signal SN_OUT outputs the ineffective pulse.

With continued reference to FIG. 7, for the 3rd effective pulse (corresponding to the third stage t3 in the drawing) of the first output signal SN_NEXT, a time period of the 3rd effective pulse partially overlaps with the time period of the effective pulse of the frequency control signal SN_ctrl, and the frequency control signal SN_ctrl is switched from the ineffective pulse to the effective pulse in the time period thereof. At this time, the second output signal SN_OUT is configured to output the effective pulse by the control of the second control portion 20 and the frequency control signal SN_ctrl.

With continued reference to FIG. 7, the 4th effective pulse (corresponding to a fifth stage t5 in the drawing) of the first output signal SN_NEXT is used as an example, and the time period of the 4th effective pulse is outside the time period of the effective pulse of the frequency control signal SN_ctrl. At this time, the second output signal SN_OUT is configured to output the ineffective pulse by the control of the second control portion 20 and the frequency control signal SN_ctrl.

As can be learned from the driving timing shown in FIG. 7, the shift register 110 according to the embodiments of the present disclosure may select and output the effective pulse of the first control portion 10 by using the second control portion 20 and the frequency control signal SN_ctrl, that is, the shift register 110 can limit the output of a part of effective pulses, so that the shift register 110 can control a number of the effective pulses and adjust the pulse variation frequency of the second output signal SN_OUT output by the shift register 110 on the basis of ensuring that the effective pulse of the second output signal SN_OUT actually output is the complete effective pulse. In a practical application, when the display panel is in different display states, for example, different display modes display different display contents, the switching of the drive frequency may be achieved by the control of the second control portion 20 and the frequency control signal SN_ctrl in the shift register 110, for example, the drive frequency is switched between the 60 hz and the 120 hz to adapt to the corresponding display states. In this manner, the smoothness of the display screen is ensured, the display effect is improved, or the drive power consumption and power consumption is reduced.

It can be seen from the above that the function of the frequency control signal is mainly to limit the output of the effective pulse of the first output signal SN_NEXT, to control a number of effective pulses and to adjust the drive frequency. On this basis, the second control unit and the frequency control signal in the embodiments of the present disclosure will be described below for adjusting the pulse variation frequency of the second output signal SN_ctrl and the drive frequency of the corresponding panel.

With continued reference to FIG. 7, a pulse variation frequency of the first output signal is F1, and a pulse variation frequency of the second output signal is F2, where F1≥F2.

Here, as described above, it should be understood that the second control portion 20 and the frequency control signal SN_ctrl are responsible for limiting the output of a part of effective pulses on the basis of the first output signal SN_NEXT output by the first control portion 10. It can be seen that a number of effective pulses of the second output signal SN_OUT output by the second control portion 20 will certainly not exceed a number of effective pulses in the first output signal SN_NEXT in the same time period, that is, the pulse variation frequency F2 of the second output signal SN_OUT will certainly not exceed the pulse variation frequency F1 of the first output signal SN_NEXT in this time period, that is, F2≤F1.

More specifically, when the time period of the effective pulse of the first output signal SN_NEXT is within the time period of the effective pulse of the frequency control signal SN_ctrl, F1=F2. When the time period of the effective pulse of the first output signal partially overlaps with the time period of the effective pulse of the frequency control signal SN_ctrl, and the frequency control signal SN_ctrl is switched from the ineffective pulse to the effective pulse in the time period thereof, or the time period of the effective pulse of the first output signal SN_NEXT is outside the time period of the effective pulse of the frequency control signal SN_ctrl, the second output signal SN_OUT outputs the ineffective pulse, so that a number of effective pulses in the second output signal SN_OUT is less than a number of effective pulses of the first output signal SN_NEXT in the same time period, F1>F2.

With continued reference to FIG. 6, when the time period of the effective pulse of the first output signal SN_NEXT_i of the i-th stage of shift register is within the time period of the effective pulse of the frequency control signal SN_ctrl, at this time, the second control portion 20 outputs the effective pulse. The number of effective pulses is the same as the number of effective pulses of the first output signal SN_NEXT_i, so that the pulse variation frequency thereof is consistent, and F2=F1.

When the first output signal SN_NEXT_k of the k-th stage shift register and the first output signal SN_NEXT_k of the n-th stage shift register have a time period in which the effective pulse partially overlaps with the effective pulse of the frequency control signal SN_ctrl or is outside the time period of the effective pulse of the frequency control signal SN_ctrl, at this time, the second control portion 20 outputs the ineffective pulse, the number of effective pulses is less than the number of effective pulses of the first output signal SN_NEXT (the first output signal SN_NEXT_k of the k-th stage shift register and the first output signal SN_NEXT_k of the n-th stage shift register), so that the pulse variation frequency thereof is reduced, and F2<F1.

With continued reference to FIG. 7, in a specific embodiment, within at least a part of time periods that the display panel works, the first output signal SN_NEXT is the effective pulse and the second output signal SN_OUT is the effective pulse. Further, in a specific embodiment, within at least a part of time periods that the display panel works, the first output signal SN_NEXT is the effective pulse and the second output signal SN_OUT is the ineffective pulse for at least a part of time periods during which the display panel works.

Here, in the at least the part of time periods during which the display panel works, the first output signal SN_NEXT and the second output signal SN_OUT are both effective pulses, that is, it is represented that in the at least the part of time periods, a time period of an effective pulse within the time period of the effective pulse of the frequency control signal SN_ctrl exists in the first output signal SN_NEXT, whereby the second output signal SN_OUT may provide the effective pulse to the display panel, thereby driving the corresponding pixel circuit in the display panel to work normally. Conversely, during the at least the part of time period during which the display panel works, the first output signal SN_NEXT is the effective pulse, and the second output signal SN_OUT is the ineffective pulse, that is, it is represented that in the at least the part of time periods, a time period of an effective pulse partially overlapping with the time period of the effective pulse of the frequency control signal SN_ctrl or outside time period of the effective pulse, exists in the first output signal SN_NEXT. In this case, the second output signal SN_OUT provides the ineffective pulse to the display panel. In this manner, it is avoided that the incomplete drive signal is provided to the display panel to cause the abnormal working of the pixel circuit, but also it is possible to control the drive frequency of the display panel, thereby improving the display effect or the drive power consumption.

An embodiment of the present disclosure further provides a pixel circuit. FIGS. 8 to 13 are schematic structural diagrams of six pixel circuits according to an embodiment of the present disclosure. Referring to FIG. 3 and FIGS. 8 to 13, in the embodiment of the present disclosure, a display panel includes a pixel circuit 200, and the second output signal SN_OUT of a driver circuit 100 is a control signal of a preset module of the pixel circuit 200. When the second output signal SN_OUT is an effective pulse, the preset module is turned on. When the second output signal SN_OUT is an ineffective pulse, the preset module is turned off.

Referring to the pixel circuit shown in FIGS. 8 to 13 below, a process in which the driver circuit 100 drives the preset module therein will be described. Firstly, it will be understood by those skilled in the art that the pixel circuit 200 shown in FIGS. 8 to 13 may include a data write module 210, a drive module 220, and a compensation module 230. The drive module 220 includes a drive transistor T2 for providing a drive current to the light-emitting element 300 of the display panel 100. The data write module 210 is connected to a first electrode (i.e., an N2 node) of the drive transistor T2 and is configured to provide a data signal for the drive transistor T2. The compensation module 230 is connected between a gate of the drive transistor (i.e., the N1 node) and a second electrode (i.e., the N3 node) of the drive transistor and is configured for compensating a threshold voltage of the drive transistor T2.

Moreover, the pixel circuit may further include a reset module 250, an initialization module 260, and a light-emitting control module 270. The reset module 250 is configured to provide a reset signal Vref to a gate of the drive transistor T2. The initialization module 260 is configured to provide an initialization signal Vini to the light-emitting element 300. The light-emitting control module 270 is configured to selectively allow the light-emitting element 300 to enter the light-emitting stage. Optionally, the light-emitting control module 270 includes a first light-emitting control module 271 and a second light-emitting control module 272. The first light-emitting control module 271 is connected between the first power supply signal terminal and one electrode of the drive transistor T2. The second light-emitting control module 272 is connected between another electrode of the drive transistor T2 and the light-emitting element 300.

The control terminal of the data write module 210 is configured to receive a first scan signal S1, and the first scan signal S1 is configured to control the on and off of the data write module 210. A control terminal of the compensation module 230 is configured to receive a second scan signal S2, and the second scan signal is configured to control the on and off of the compensation module 230. A control terminal of the reset module 250 is configured to receive a third scan signal S3, and the third scan signal S3 is configured to control the on and off of the reset module 250. A control terminal of the initialization module 260 is configured to receive a fourth scan signal S4, and the fourth scan signal S4 is configured to control the on and off of the initialization module 260. A control terminal of the light-emitting control module 270 is configured to receive a light-emitting control signal EM, and the light-emitting control signal EM is configured to control the on and off of the light-emitting control module 270.

The data write module 210 includes a data write transistor T1, and the first scan signal S1 is configured to control the on and off of the data write transistor T1. The compensation module 230 includes a compensation transistor T3, and the second scan signal S2 is configured to control the on and off of the compensation transistor T3. The reset module 250 includes a reset transistor T5, and the third scan signal S3 is configured to control the on and off of the reset transistor T5. The initialization module 260 includes an initialization transistor T6, and the fourth scan signal S4 is configured to control the on and off of the initialization transistor T6. The first light-emitting control module 271 includes a first light-emitting control transistor T7, and the second light-emitting control module 272 includes a second light-emitting control transistor T8, and the light-emitting control signal EM is configured to control the on and off of the first light-emitting control transistor T7 and the on and off of the second light-emitting control transistor T8.

Figure 10:
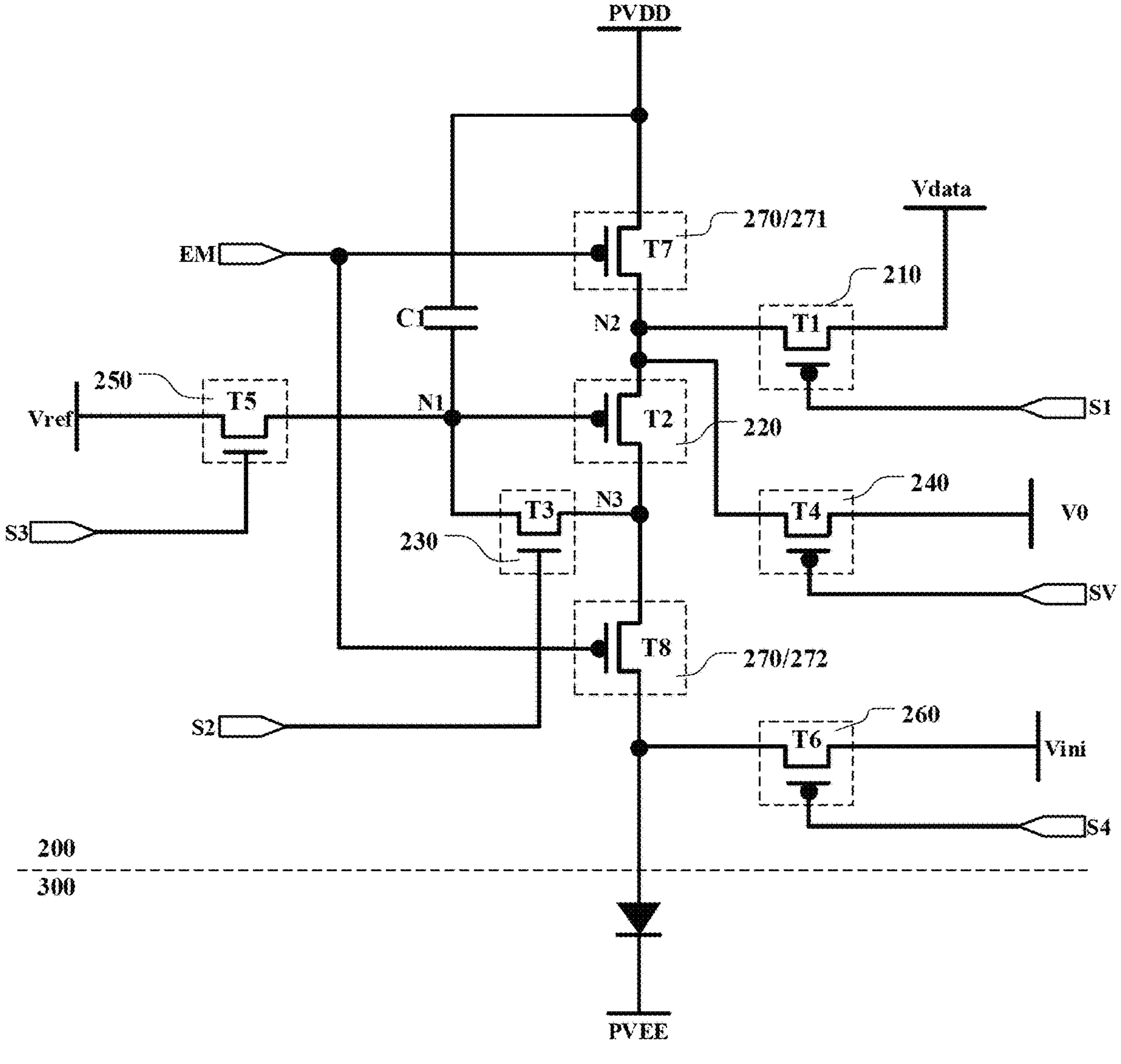
Figure 11:
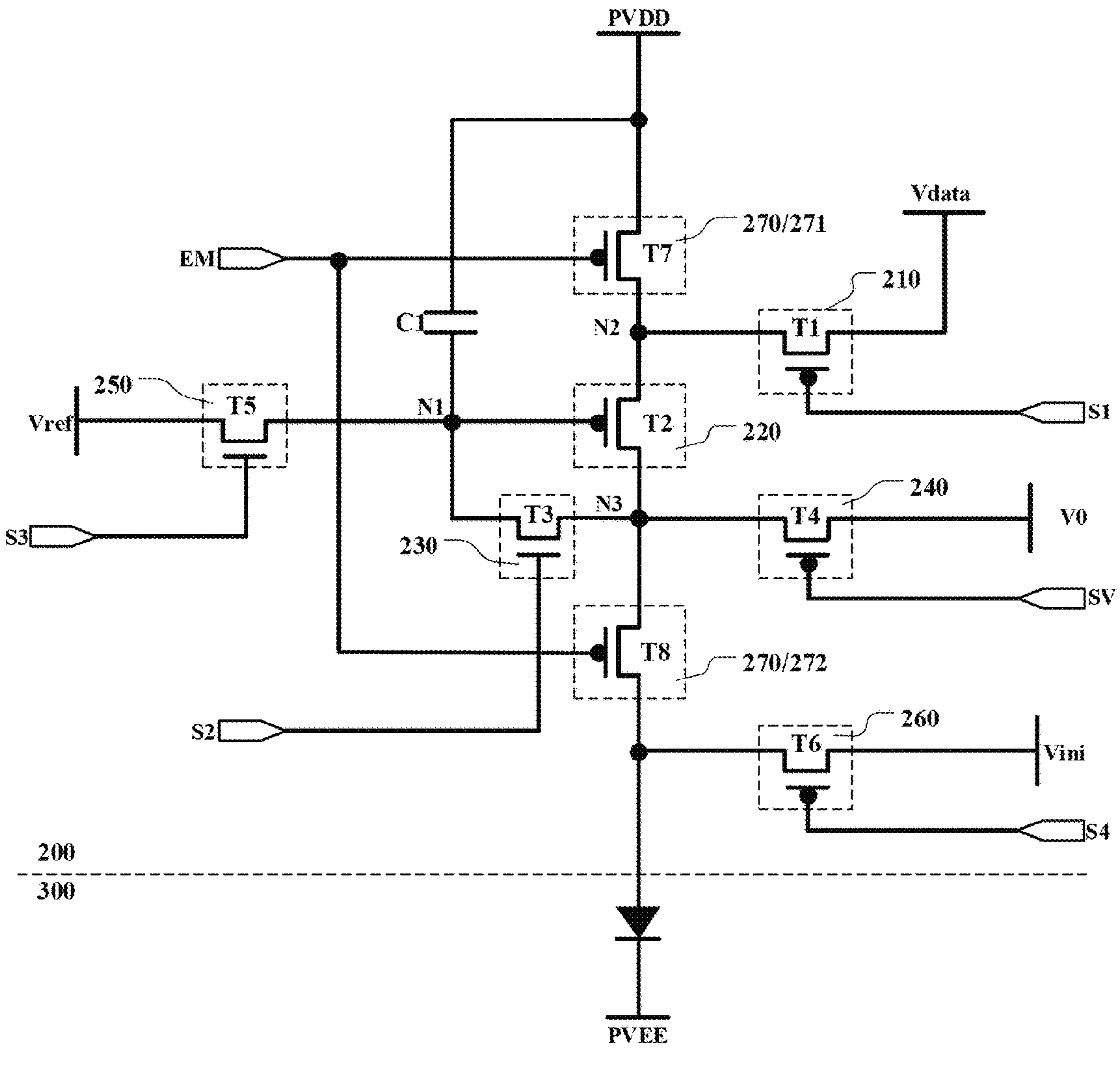
Figure 12:
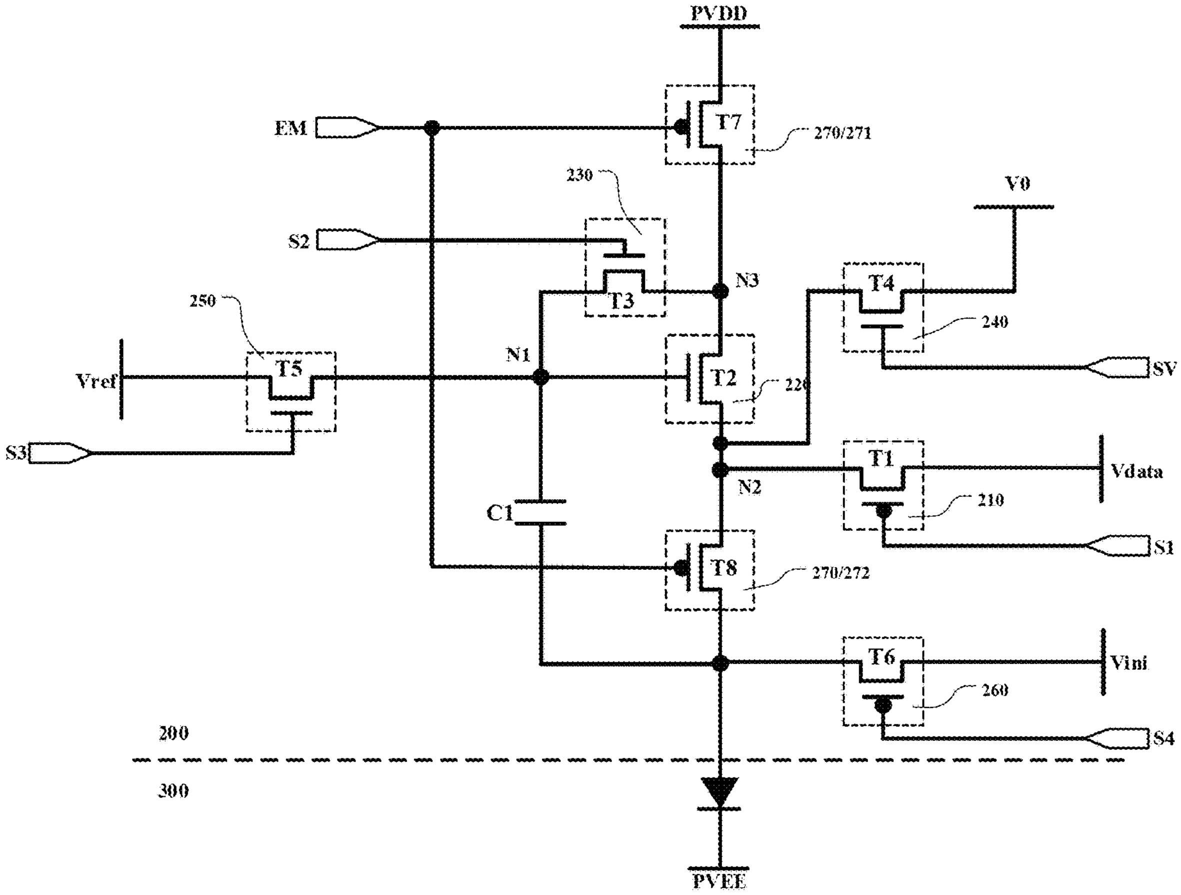
Figure 13:
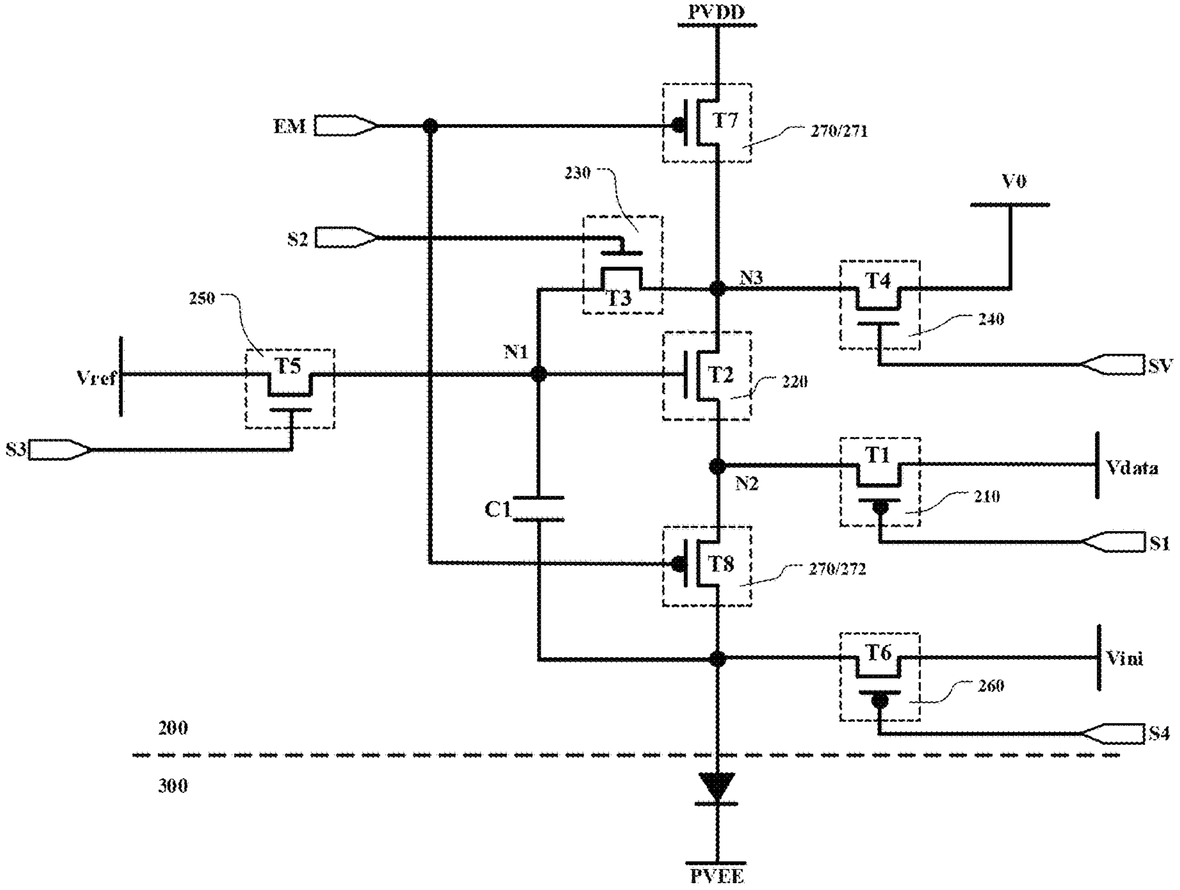

It should be noted that, as shown in FIGS. 10 to 13, the pixel circuit may further include a bias adjustment module 240 for providing a bias adjustment signal for the drive transistor T2. Optionally, as shown in FIGS. 10 and 12, the bias adjustment module 240 is connected to the first electrode (i.e., the N2 node) of the drive transistor T2. Optionally, as shown in FIGS. 11 and 13, the bias adjustment module 240 is connected to the second electrode (i.e., the N3 node) of the drive transistor T2. Optionally, a control terminal of the bias adjustment module 240 is configured to receive a bias adjustment control signal SV, and the bias adjustment control signal SV is configured to control the on and off of the bias adjustment module 240. The bias adjustment module 240 includes a bias adjustment transistor T4, and the bias adjustment control signal SV is configured to control the on and off of the bias adjustment transistor T4.

Figure 8:
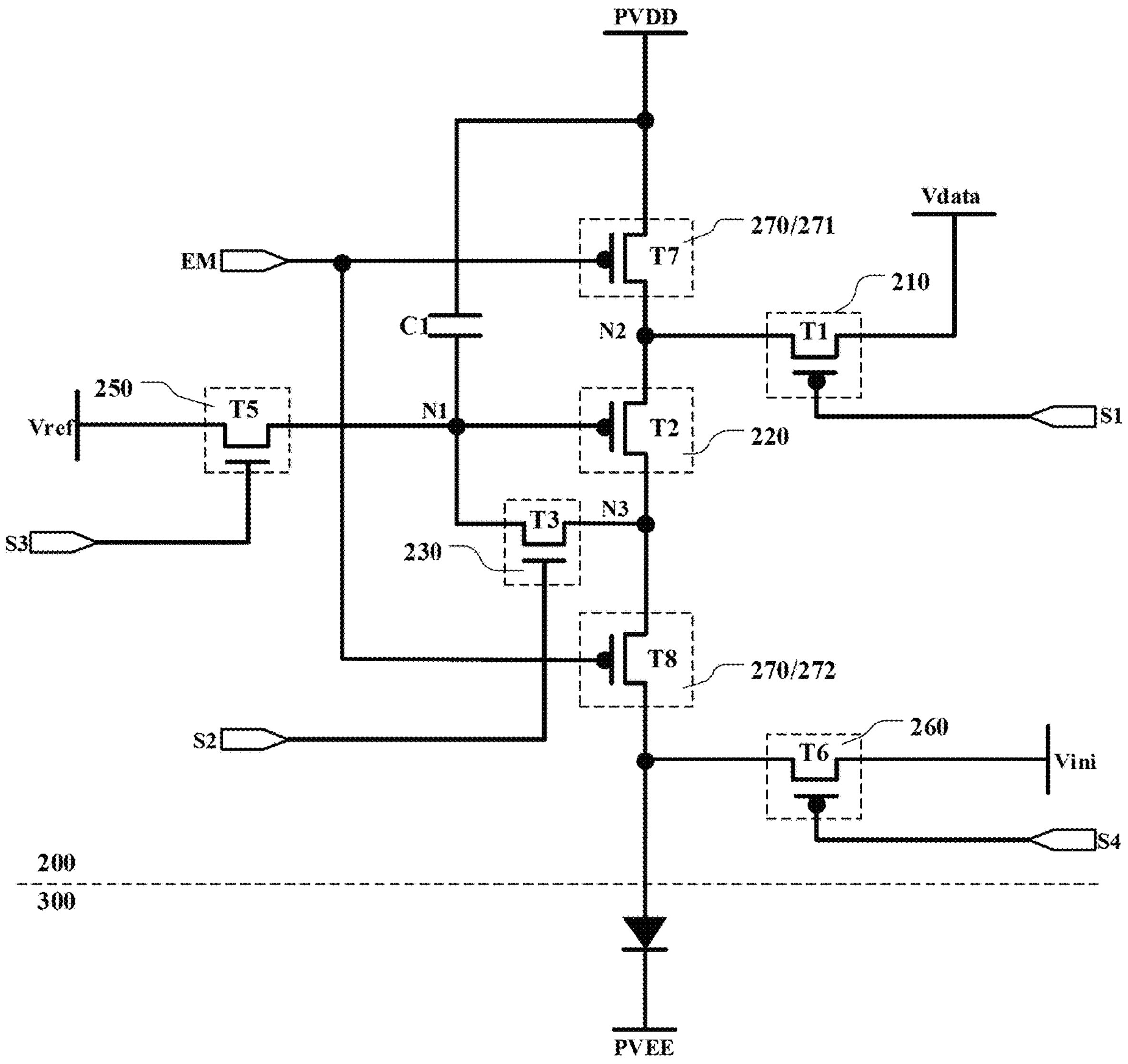
FIGS. 8 to 13 are schematic structural diagrams of six pixel circuits according to an embodiment of the present disclosure.
Figure 9:
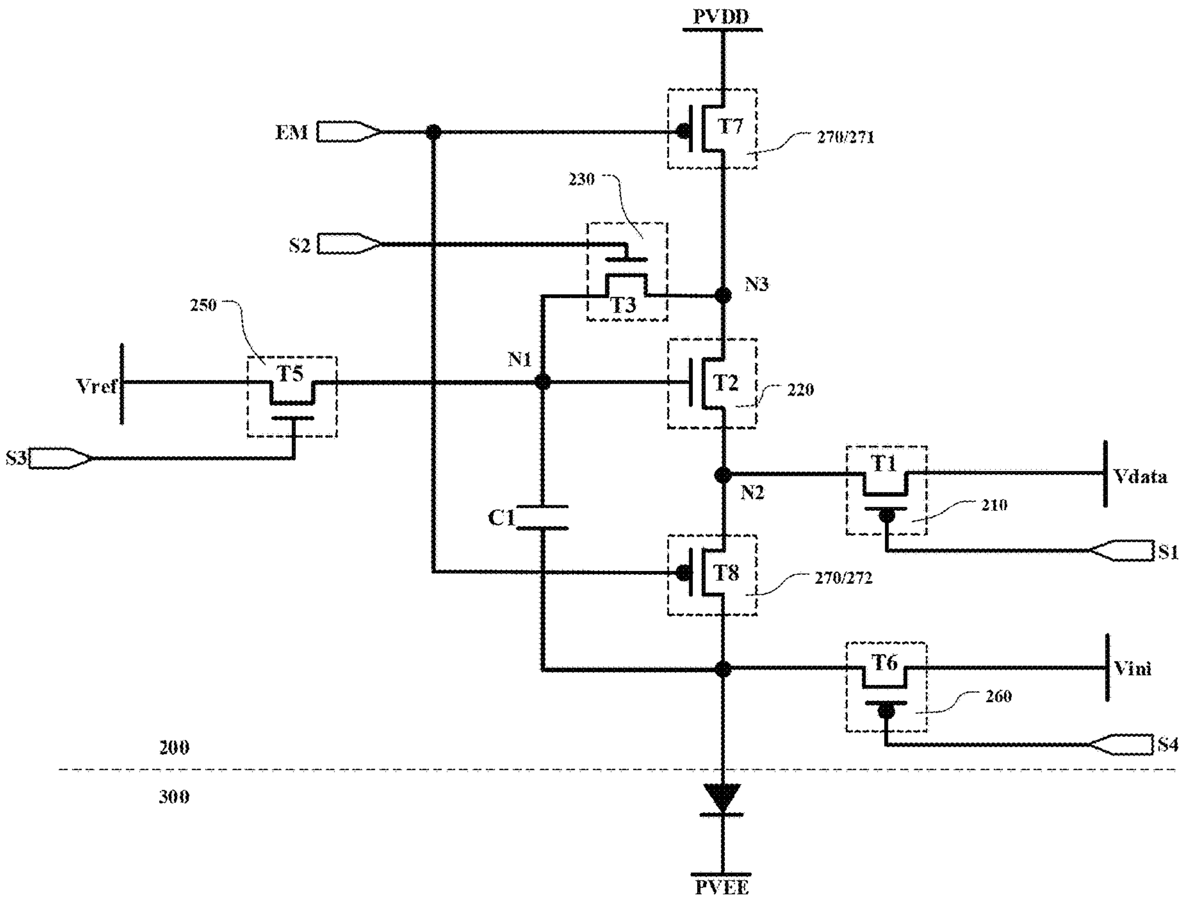

In addition, it should be noted that in the pixel circuit shown in FIGS. 8, 10, and 12, the drive transistor T2 is a PMOS-type transistor, the pixel circuit further includes a storage capacitor C1, a first electrode of the storage capacitor is connected to the first power supply signal terminal, and a second electrode of the storage capacitor is connected to the gate of the drive transistor T2 and is configured for storing a signal transmitted to the gate of the drive transistor T2. In the pixel circuits shown in FIGS. 9, 11, and 13, the drive transistor T2 is an NMOS-type transistor, the pixel circuit further includes a storage capacitor C1, a first electrode of the storage capacitor C1 is connected to the light-emitting element 300, and a second electrode of the storage capacitor C1 is connected to the gate of the drive transistor T2 and is configured for storing a signal transmitted to the gate of the drive transistor T2.

In this embodiment, the pixel cell is configured to receive the power supply signals PVDD and PVEE, and generates a drive current by the potential difference between the power supply signals PVDD and PVEE, thereby driving the light-emitting element to emit light. The PVDD signal may be a positive power supply signal, and the PVEE signal may be a negative power supply signal.

In addition, FIGS. 8 to 13 are merely illustrative of the structure of several pixel circuits, but do not include all of them. The power supply signals PVDD and PVEE satisfy the other pixel circuits defined in the present application, and all of them fall within the scope of protection of the present embodiment. Details are not described in the present embodiment.

Based on the various pixel circuits described above, the driver circuit 100 in the embodiment of the present disclosure may supply a control signal to the data write module 210, the drive module 220, the compensation module 230, the reset module 250, the initialization module 260, the bias adjustment module 240, or the light-emitting control module 270 therein, that is, the preset module of the pixel circuit 200 may be any one of the data write module 210, the drive module 220, the compensation module 230, the reset module 250, the initialization module 260, the bias adjustment module 240, or the light-emitting control module 270, and the second output signal SN_OUT of the driver circuit 100 may be a control signal of any one of the modules described above. Taking the second output signal SN_OUT of the driver circuit 100 as a control signal of the data write module 210 as an example, the driving principle of the pixel circuit 200 will be described below.

Referring to FIG. 6, generally, the shift registers 110 of different stages provide drive signals to the pixel circuits 200 of different rows, i.e., data write control signals to the data write modules 210 of the pixel circuits 200 of different rows. The i-th shift register is used as an example, when the time period of the effective pulse of the first output signal SN_NEXT_i is within the time period of the effective pulse of the frequency control signal SN_ctrl, the second output signal SN_OUT outputs the effective pulse. For the j-th stage shift register, the time period of the effective pulse of the first output signal SN_NEXT_j partially overlaps with the time period of the effective pulse of the frequency control signal SN_ctrl, and the frequency control signal SN_ctrl is switched from the effective pulse to the ineffective pulse, and the second output signal SN_OUT outputs the effective pulse. In this case, the data write module 210 is turned on, the pixel circuit 200 starts writing a data signal, and the storage capacitor C1 starts charging. Moreover, since the second output signal SN_OUT outputs the effective pulse as the complete effective pulse, the storage capacitor C1 may be sufficiently charged, so that the light-emitting element 300 can normally emit light as required during the light-emitting stage. As for the k-th stage of shift register and the n-th stage of shift register, the time period of the effective pulse of the first output signal SN_NEXT_k partially overlaps with the time periods of the effective pulses of the frequency control signal SN_ctrl or the time periods of the effective pulse of the first output signal SN_NEXT_n is outside the time periods of the effective pulses of the frequency control signal SN_ctrl, whereby the second output signal SN_OUT outputs the ineffective pulse, the data write module 210 cannot be turned on, the charging process cannot be achieved, and the corresponding light-emitting element 300 cannot emit the light. As can be seen from this, the shift register 110 can control whether the light-emitting elements 300 of different rows emit light, the storage capacitor C1 cannot be fully charged due to the output of the incomplete effective pulse, so that the light-emitting element 300 cannot normally emit the light as required in the light-emitting stage may be avoided.

Referring to FIG. 7, for the same pixel circuit 200, the second output signal SN_OUT is responsible for providing a data write control signal to the data write module 210 of the pixel circuit 200. The time period of the 2nd effective pulse of the first output signal SN_NEXT (the first period t1) is within the time period of the effective pulse of the frequency control signal SN_ctrl, and the second output signal SN_OUT outputs the effective pulse. The time period (third stage t3) of the 3rd effective pulse of the first output signal SN_NEXT partially overlaps with the effective pulse of the frequency control signal SN_ctrl, and the frequency control signal SN_ctrl is switched from the effective pulse to the ineffective pulse at the third stage t3, and the second output signal SN_OUT outputs the effective pulse. In this case, the data write module 210 is turned on, the pixel circuit 200 starts writing a data signal, and the storage capacitor C1 starts charging. Moreover, since the second output signal SN_OUT outputs the effective pulse as the complete effective pulse, the storage capacitor C1 may be fully charged, and the light-emitting element 300 at this time can normally emit the light at the light-emitting stage as required. For the 1st and 4th effective pulses of the first output signal SN_NEXT, the time period of the 1st and 4th effective pulses partially overlaps with or does not overlap with the time period of the effective pulse of the frequency control signal SN_ctrl, and the second output signal SN_OUT outputs the ineffective pulse. Therefore, the data write module 210 cannot be turned on, and the charging process cannot be achieved, that is, the light-emitting element 300 at this time cannot emit the light in the light-emitting stage. It can be seen that the shift register 110 is configured to control the same light-emitting element 300 to emit the light or not, and control the number of times that the light-emitting element 300 emits light within a period of time, that is, control the light-emitting frequency of the light-emitting element 300. Similarly, a case that the storage capacitor C1 cannot be fully charged due to the output of the incomplete effective pulse is avoided, so that the light-emitting element 300 cannot normally emit the light as required in the light-emitting stage may also be avoided.

It can be understood that for other modules in the pixel circuit 200, during the turn-on process in each data refresh cycle, the other modules directly affect whether this pixel circuit 200 can drive the corresponding light-emitting element 300 to emit the light. In other words, for other modules except the data write module 210, when the second output signal SN_OUT is used as the control signal, the shift register 110 may control whether the corresponding light-emitting element 300 can emit the light normally, and it may be derived by those skilled in the art according to the implementation manner of the specific function of each module, and details are not described here. It should be noted that, in addition, the preset module in the pixel circuit 200 here refers to a module with a control signal directly input from the outside, for example, the data write module 210, the compensation module 230, the reset module 250, the initialization module 260, the bias adjustment module 240, or the light-emitting control module 270. For the drive module 220, which is controlled to be turned on or off by the input data signal, the drive module 220 is not directly controlled by the external signal. Therefore, the second output signal SN_OUT of the driver circuit 100 in the present disclosure cannot be used as the control signal of the preset module of the pixel circuit 200.

More specifically, referring to FIGS. 8 to 13, the preset module as the data write module 210 is used as an example, the preset module in the pixel circuit described above may include an N-channel metal oxide semiconductor (NMOS)-type transistor, and the second output signal SN_OUT is a control signal of the NMOS-type transistor. When the second output signal SN_OUT is a high level signal, the second output signal SN_OUT is the effective pulse to control the NMOS-type transistor to be turned on. It should be understood that the data write module 210 shown in FIGS. 8 to 13 may likewise be provided to include the p-channel metal oxide semiconductor (PMOS)-type transistor. At this time, if the second output signal SN_OUT is a control signal of the PMOS-type transistor, when the second output signal SN_OUT is a low level signal, the second output signal SN_OUT is the effective pulse to control the PMOS-type transistor to be turned on.

Apparently, the preset module may be other modules in the pixel circuit 200, for example, the preset module may be the compensation module 230, the reset module 250, the initialization module 260, the bias adjustment module 240, or the light-emitting control module 270. Referring to FIGS. 8 to 13, the reset module 250 includes the PMOS-type transistor, the second output signal SN_OUT is the control signal of the PMOS-type transistor, and when the second output signal SN_OUT is a low level signal, the second output signal SN_OUT is the effective pulse to control the PMOS-type transistor to be turned on. Since those skilled in the art may be known that the effective pulse of the NMOS-type transistor and the effective pulse of the PMOS-type transistor are at different potential levels, and the timing of the second output signal SN_OUT of the PMOS-type transistor will not be illustrated in the drawings here.

Figure 14:
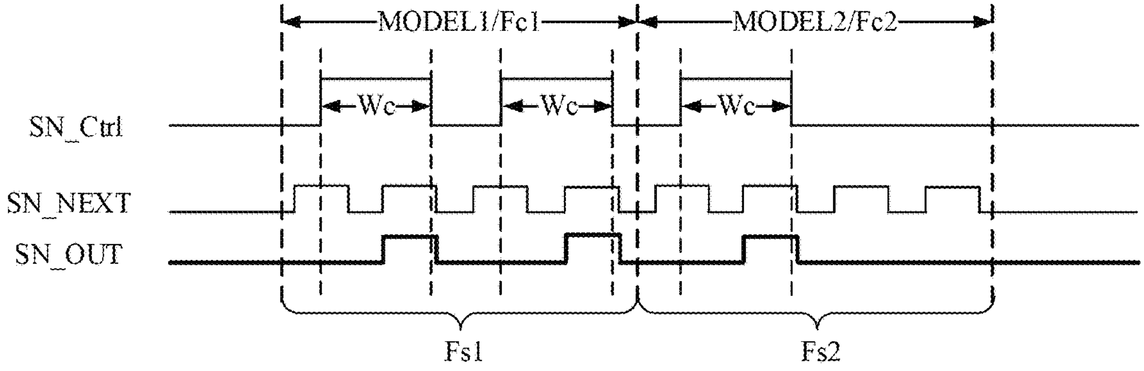
FIGS. 14 and 15 are drive timing diagrams of two display panels according to an embodiment of the present disclosure.
Figure 15:
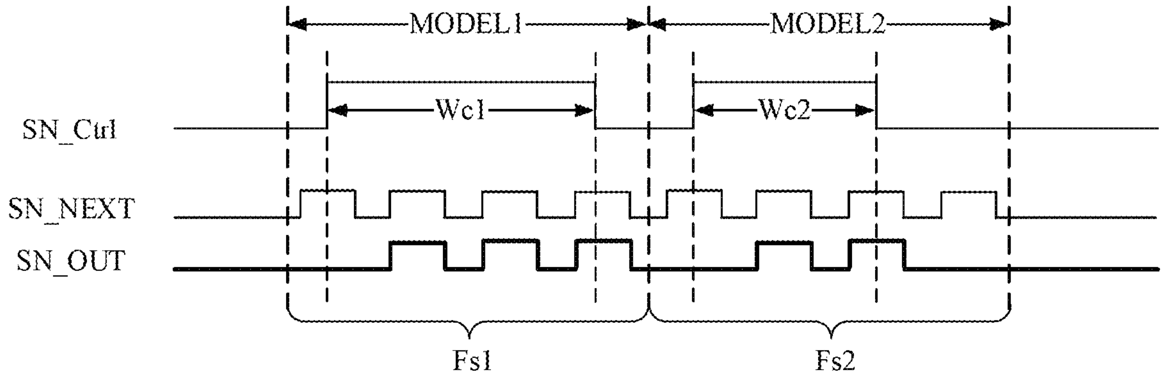

As described above, since each shift register 110 may control the light-emitting frequency of the corresponding light-emitting element 300 through the second control portion 20 and the frequency control signal SN_ctrl, the working mode of the display panel may be changed as a whole. FIGS. 14 and 15 are drive timing diagrams of two display panels according to an embodiment of the present disclosure. Referring to FIGS. 14 and 15, in an optional embodiment of the present disclosure, a working process of the display panel may include a first mode MODEL1 and a second mode MODEL2. In the first mode MODEL1, the pulse variation frequency of the frequency control signal SN_ctrl is Fc1, and in the second mode MODEL2, the pulse variation frequency of the frequency control signal SN_ctrl is Fc2, where Fc1≠Fc2, as shown in FIG. 14; and/or, in the first mode MODEL1, the time length of the effective pulse of the frequency control signal SN_ctrl is Wc1, and in the second mode MODEL2, the time length of the effective pulse of the frequency control signal SN_ctrl is Wc2, where Wc1≠Wc2, as shown in FIG. 15.

As can be seen from FIGS. 6 and 7, the second output signal SN_OUT of the shift register 110 is mainly generated by the control of the second control portion 20 by controlling the frequency control signal SN_ctrl according to the first output signal SN_NEXT output by the first control portion 10. Whether the second output signal SN_OUT outputs the effective pulse depends on the effective pulse of the frequency control signal SN_ctrl, so that both the frequency Fc and the time length Wc of the effective pulse of the frequency control signal SN_ctrl may change the number and the frequency of the effective pulse of the second output signal SN_OUT. It is understood simply from an example that one effective pulse of the second output signal SN_OUT corresponds to a light-emitting of the light-emitting element 300. The pulse variation frequency Fc of the frequency control signal SN_ctrl or the time length Wc of the effective pulse of the frequency control signal SN_ctrl directly determines the number of light-emitting or the frequency of light-emitting of the light-emitting element 300. Therefore, the number of times or frequency of screen refreshing of the display panel may be macroscopically controlled by controlling all light-emitting elements 300, thereby achieving the adjustment and switching of the working mode. Whereby, this embodiment essentially controls the drive process of the pixel circuit 200 in the display panel based on the pulse variation frequency of the frequency control signal SN_ctrl or the time length of the effective pulse of the frequency control signal SN_ctrl, so as to adjust the light-emitting state of the light-emitting element 300, thereby implementing different operation modes of the display panel macroscopically.

On the basis of the above embodiments, in the first mode MODEL1, a pulse variation frequency of the second output signal SN_OUT is Fs1, and in the second mode MODEL2, a pulse variation frequency of the second output signal SN_OUT is Fs2, where Fs1≠Fs2.

As can be seen from FIGS. 14 and 15, the frequency control signal SN_ctrl directly determines the output of the effective pulse of the second output signal SN_OUT. Therefore, in different working modes of the display panel, if the frequencies Fc of the frequency control signals SN_ctrl in the different working modes are different or the time lengths Wc of the effective pulses of the frequency control signals SN_ctrl in the different working modes are different, the frequencies of corresponding second output signals SN_OUT in the different working modes are also different. That is, in two different working modes of the first mode MODEL1 and the second mode MODEL2, the pulse frequency Fs1 of the second output signal SN_OUT is necessarily different from the pulse frequency Fs2 of the second output signal SN_OUT.

Still Further, (Fc1−Fc2)×(Fs1−Fs2)>0, and/or (Wc1−Wc2)×(Fs1−Fs2)>0.

It should be understood that since the effective pulse of the frequency control signal SN_ctrl directly determines the output of the effective pulse of the second output signal SN_OUT, and the number of effective pulses of the frequency control signal SN_ctrl and the time length of the frequency control signal SN_ctrl determine the number of effective pulses of the second output signal SN_OUT. When the number of effective pulses of the frequency control signal SN_ctrl increases or the time length of the effective pulse of the frequency control signal SN_ctrl increases, the number of effective pulses of the second output signal SN_OUT increases, that is, in the same time period, the number of effective pulses of the second output signal SN_OUT is positively correlated with the number of effective pulses of the frequency control signal SN_ctrl and the time length of the effective pulse of the frequency control signal SN_ctrl, respectively. Therefore, the pulse variation frequency Fs of the second output signal SN_OUT is positively correlated with the pulse variation frequency Fc of the frequency control signal SN_ctrl and the time length Wc of the frequency control signal SN_ctrl, respectively. The larger the pulse variation frequency Fc of the frequency control signal SN_ctrl and the larger the time length Wc, the larger the pulse variation frequency Fs of the second output signal SN_OUT. Based on this, in both the first mode MODEL1 and the second mode MODEL2, when Fc1−Fc2>0, then Fs1−Fs2>0; when Fc1−Fc2<0, then Fs1−Fs2<0. Therefore, in the first mode MODEL1 and the second mode MODEL2, the pulse variation frequency Fc of the frequency control signal SN_ctrl and the pulse variation frequency Fs of the second output signal SN_OUT satisfy (Fc1−Fc2)×(Fs1−Fs2)>0. Similarly, in both the first mode MODEL1 and the second mode MODEL2, when Wc1−Wc2>0, then Fs1−Fs2>0; When Wc1−Wc2<0, then Fs1−Fs2<0. Therefore, in the first mode MODEL1 and the second mode MODEL2, the time length Wc of the frequency control signal SN_ctrl and the pulse variation frequency Fs of the second output signal SN_OUT satisfy $(Wc1-Wc2)\times(Fs1-Fs2)>0$.

Figure 16:
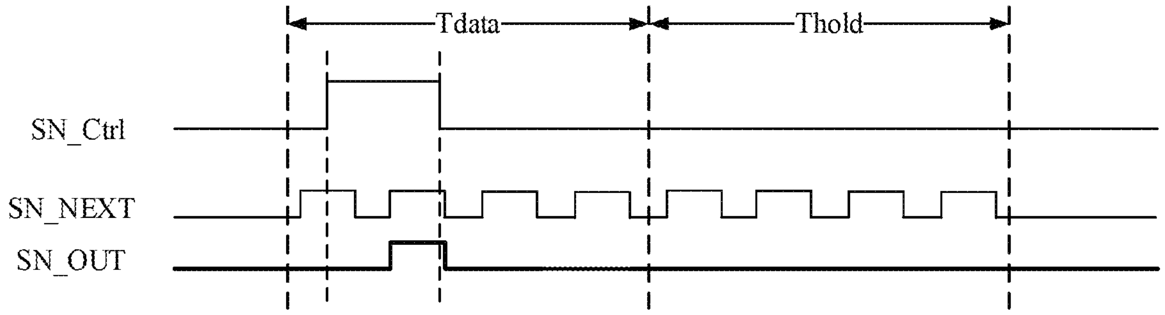
FIG. 16 is a drive timing diagram of a pixel circuit according to an embodiment of the present disclosure.

FIG. 16 is a drive timing diagram of a pixel circuit according to an embodiment of the present disclosure. With reference to FIGS. 8 to 13, and FIG. 16, it is continued that, optionally, in the embodiments of the present disclosure, the working process of the pixel circuit 200 includes a data write frame Tdata and a retention frame Thold. In the data write frame Tdata, the preset module is turned on. In the retention frame Thold, the preset module is turned off.

Here, the data write frame Tdata and the retention frame Thold of the pixel circuit 200 may be understood as a picture display cycle of the display panel in two working modes. In the data write frame Tdata of the pixel circuit 200, the pixel circuit 200 performs the data write and performs the light-emitting driving with the written data in the light-emitting stage. As the control signal of the preset module of the pixel circuit 200, the second output signal SN_OUT of the driver circuit 100 may cause the second output signal SN_OUT to output the effective pulse in the data write frame Tdata by setting the frequency control signal SN_ctrl (including the effective pulse, and at least the effective pulse of the first output signal SN_NEXT completely overlaps with this effective pulse) reasonably, so that the preset module is turned on, and the data write process of the pixel circuit 200 can be achieved, that is, the data write frame Tdata can be achieved. Similarly, in the retention frame Thold of the pixel circuit 200, the pixel circuit 200 does not perform the data writing, and the data stored in the storage capacitor C1 in the previous data writing frame Tdata is used for the light-emitting driving. As the control signal of the preset module of the pixel circuit 200, the second output signal SN_OUT of the driver circuit 100 may cause the second output signal SN_OUT to output the ineffective pulse in the data write frame Tdata by setting the frequency control signal SN_ctrl (not including the effective pulse, or including an effective pulse partially overlapping or not overlapping with the effective pulse existing in the first output signal SN_NEXT) reasonably, so that the preset module is turned off, whereby the pixel circuit 200 maintains the stored data without rewriting the data, and thus the retention frame Thold is achieved. It should be added, in this embodiment, the frequency control signal SN_ctrl is used to control the preset module in the pixel circuit 200, thereby achieving the control of whether data is written, and achieving different data refresh manners.

Further, in the first mode MODEL1, the data refresh frequency of the pixel circuit 200 is Fp1, and in the second mode MODEL2, the data refresh frequency of the pixel circuit is Fp2, where $Fp1\neq Fp2$.

As described above, the display panel in the embodiments of the present disclosure may control the switching of the pixel circuit 200 between the data write frame Tdata and the retention frame Thold by using the preset module of the frequency control signal SN_ctrl, that is, a number of data write frames Tdata may be controlled, thereby changing the data refresh frequency of the pixel circuit. Based on this, for the display panel, two working modes may be achieved by using the frequency control signal SN_ctrl. In the two working modes, the data refresh frequencies are different, that is, the data refresh frequency Fp1 in the first mode MODEL1 is not equal to the data refresh frequency Fp2 in the second mode MODEL2. Thus, the display may be performed at different data refresh frequencies in different application scenarios of the display panel. Exemplarily, when the display panel plays a movie or plays a game, the data refresh frequency may be correspondingly increased, so that the display of the picture is smoother, and the requirement of the user for the smoothness of the display of the picture is satisfied. When the display panel is in a static picture display, the data refresh frequency can be correspondingly reduced, the drive power consumption can be reduced, and thus the energy is saved.

Similarly, for the data refresh frequency of the pixel circuit 200, since the second output signal SN_OUT is responsible for controlling the on or off of the preset module in the pixel circuit 200, so that the data refresh frequency may be adjusted. Therefore, the pulse variation frequency Fs of the second output signal SN_OUT directly determines the data refresh frequency Fp of the pixel circuit 200, and has a positive correlation. Therefore, the larger the pulse variation frequency Fs of the second output signal SN_OUT, the larger the data refresh frequency Fp of the pixel circuit 200. In both the first mode MODEL1 and the second mode MODEL2, when $Fs1-Fs2>0$, then $Fp1-Fp2>0$. When $Fs1-Fs2<0$, then $Fp1-Fp2<0$; Therefore, in the first mode MODEL1 and the second mode MODEL2, the pulse variation frequency Fs of the second output signal SN_OUT and the data refresh frequency Fp of the pixel circuit 200 satisfy $(Fp1-Fp2)\times(Fs1-Fs2)>0$.

Figure 17:
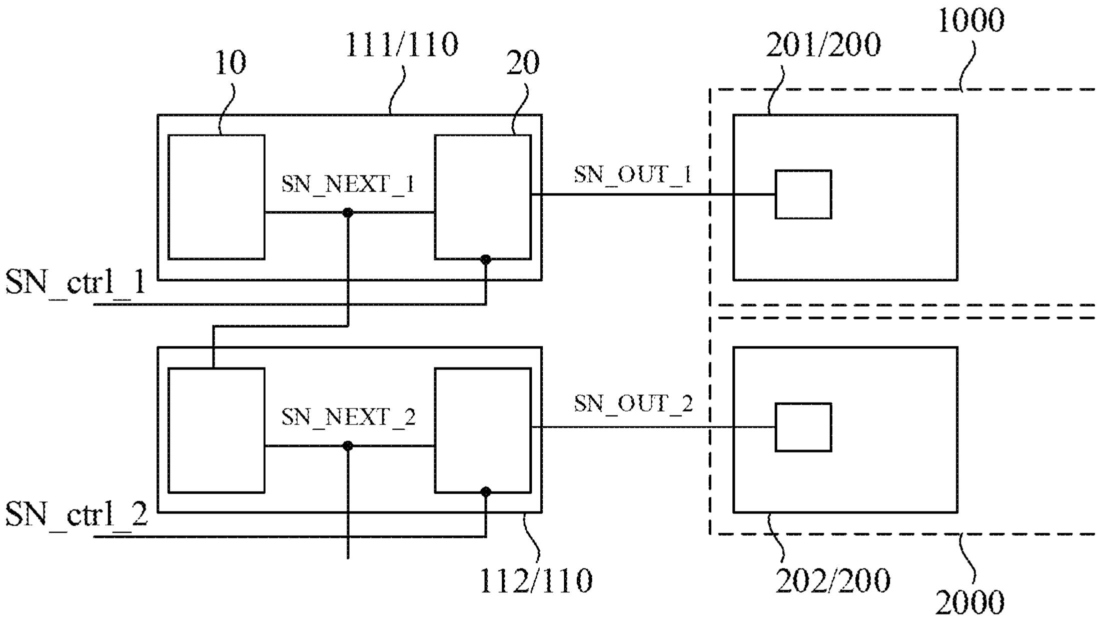
FIG. 17 is a partial schematic structural diagram of another display panel according to an embodiment of the present disclosure.
Figure 18:
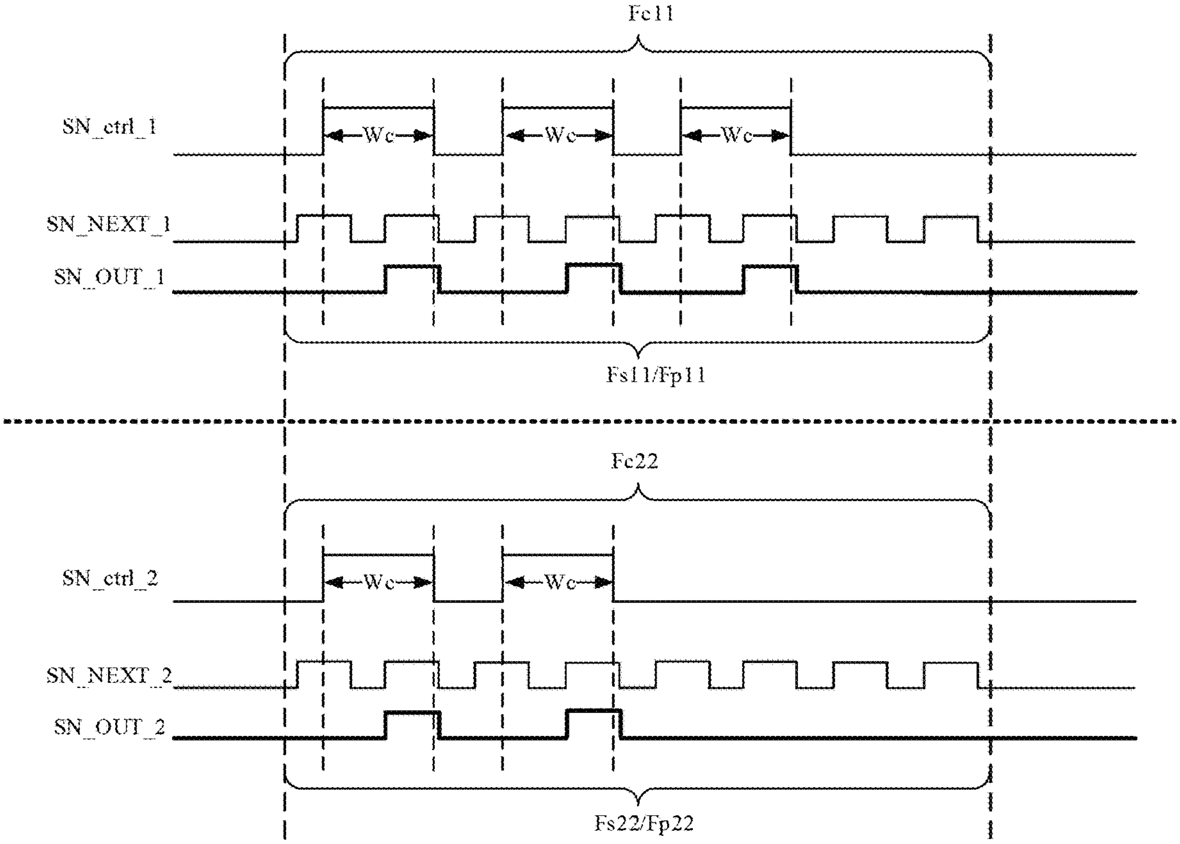
FIGS. 18 and 19 are drive timing diagrams of two shift registers shown in FIG. 17.
Figure 19:
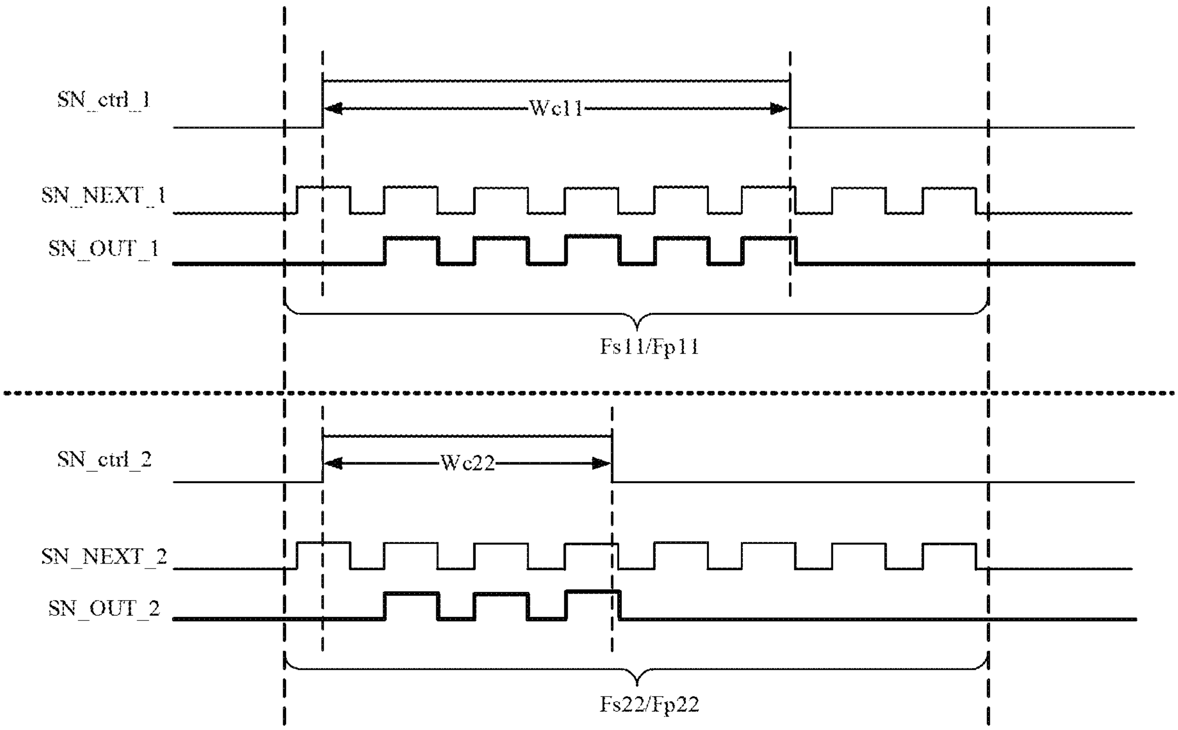

FIG. 17 is a partial schematic structural diagram of another display panel according to an embodiment of the present disclosure, and FIGS. 18 and 19 are drive timing diagrams of two shift registers shown in FIG. 17. Firstly, referring to FIG. 17, optionally, the display panel includes a first pixel circuit 201 and a second pixel circuit 202. The drive circuit includes a first shift register 111 and a second shift register 112. The second output signal SN_OUT of the first shift register 111 is a control signal of the first preset module of the first pixel circuit 201, and a second output signal SN_OUT of the second shift register 112 is a control signal of the second preset module of the second pixel circuit 202.

Referring to FIGS. 18 and 19, the pulse variation frequency of the frequency control signal SN_ctrl received by the first shift register 111 is Fc11, and the pulse variation frequency of the frequency control signal SN_ctrl received by the second shift register 112 is Fc22, $Fc11\neq Fc22$, as shown in FIG. 18; and/or, a time length of the effective pulse of the frequency control signal SN_ctrl received by the first shift register 111 is Wc11, and a time length of the effective pulse of the frequency control signal SN_ctrl received by the second shift register 112 is Wc22, where $Wc11\neq Wc22$, as shown in FIG. 19.

Firstly, the first preset module in the first pixel circuit 201 and the second preset module in the second pixel circuit 202 are a same kind of preset module, for example, the foregoing preset module may be a data write module, a reset module, an initialization module, a threshold compensation module, and the like, which is not limited here. The difference thereof merely lies in belonging to different pixel circuits 200, and receiving the control of different shift registers 110. Referring to FIGS. 17 to 19, for shift registers of different stages such as the first shift register 111 and the second shift register 112, the second output signals SN_OUT thereof are control signals of the first preset modules in the first pixel circuit 201 and the second pixel circuit 202, respectively, that is, it is indicated that two shift registers 111 drive the first pixel circuit 201 and the second pixel circuit 202 correspondingly. It can be seen that the frequency control signals SN_ctrl received by each of the two shift registers 110 may actually drive a respective one of the two pixel circuits 200, respectively, different frequency control signals SN_ctrl may be provided for the two shift registers 111, that is, the pulse change frequencies Fc of the frequency control signals SN_ctrl of the two shift registers 111 are different and/or the time lengths Wc of effective pulses are different, to adjust the driving states of the two pixel circuits 200, respectively, so as to achieve different data refresh frequencies and the like.

Based on that the pulse variation frequencies Fc of the frequency control signals SN_ctrl received by the two shift registers 110 are different and/or the time lengths Wc of the effective pulses of the frequency control signals SN_ctrl received by the two shift registers 110 are different, the pulse variation frequencies of the second output signals SN_OUT output by the two shift registers 110 may also be different, that is, the pulse variation frequencies of the second output signal SN_OUT received by the preset modules of the two pixel circuits 200 may also be different. A pulse variation frequency of the second output signal received by the first preset module is Fs11, and a pulse variation frequency of the second output signal received by the second preset module is Fs22, and Fs11≠Fs22.

Further, for the two shift registers 110, i.e., the first shift register 111 and the second shift register 112, the pulse variation frequency Fs of the second output signal SN_OUT output by the two shift registers 110 is related to the pulse variation frequency Fc of the received frequency control signal SN_ctrl and the time length Wc of the effective pulse of the received frequency control signal SN_ctrl, and is positively correlated. Therefore, when the pulse variation frequency Fc of the frequency control signal SN_ctrl of the two shift registers satisfies Fc11−Fc22>0, the pulse variation frequency Fs of the second output signal SN_OUT output by the two shift registers satisfies Fs11−Fs22>0. On the contrary, when the pulse variation frequency Fc of the frequency control signal SN_ctrl of the two shift registers satisfies Fc11−Fc22<0, the pulse variation frequency Fs of the second output signal SN_OUT output by the two shift registers satisfies Fs11−Fs22<0. Whereby, (Fc11−Fc22)×(Fs11−Fs22)>0. Similarly, when the time length Wc of the effective pulse of the frequency control signal SN_ctrl of the two shift registers satisfies Wc11−Wc22>0, the pulse variation frequency Fs of the second output signal SN_OUT output by the two shift registers satisfies Fs11−Fs22>0. On the contrary, when the time length Wc of the effective pulse of the frequency control signal SN_ctrl of the two shift registers satisfies Wc11−Wc22<0, the pulse variation frequency Fs of the second output signal SN_OUT output by the two shift registers satisfies Fs11−Fs22<0. Whereby, (Wc11−Wc22)×(Fs11−Fs22)>0.

Further, for the two pixel circuits 200, i.e., the first pixel circuit 201 and the second pixel circuit 202, different frequency control signals SN_ctrl may be supplied to the two shift registers 111 to output the second output signals SN_OUT of different pulse change frequencies so as to adjust the driving states of the two pixel circuits 200, respectively, and further achieve different data refresh frequencies. Therefore, in the embodiments of the present disclosure, the data refresh frequency of the first pixel circuit 201 and the data refresh frequency of the second pixel circuit 202 may be set to be different. The data refresh frequency Fp11 of the first pixel circuit 201 is not equal to the data refresh frequency Fp22 of the second pixel circuit 202, i.e., Fp11≠Fp22.

Still further, for the two pixel circuits 200, i.e., the first pixel circuit 201 and the second pixel circuit 202, the data refresh frequency Fp thereof is related to the pulse variation frequency Fs of the second output signal SN_OUT received by the preset module therein, and is positively correlated.

When the pulse variation frequency Fs of the second output signal SN_OUT of the two shift registers 110 satisfies Fs11−Fs22>0, the data refresh frequency Fp of the corresponding two pixel circuits 200 satisfies Fp11−Fp22>0. On the contrary, when the pulse variation frequency Fs of the second output signal SN_OUT of the two shift registers 110 satisfies Fs11−Fs22<0, the corresponding data refresh frequency Fp of the two pixel circuits 200 satisfies Fp11−Fp22<0. Whereby, (Fp11−Fp22)×(Fs11−Fs22)>0.

With continued reference to FIG. 17, the display panel may include a first display region 1000 and a second display region 2000, the first pixel circuit 201 is located in the first display region 1000, and the second pixel circuit 202 is located in the second display region 2000.

Thus, the first pixel circuit and the second pixel circuit as described above are substantially disposed in two display regions of the display panel, whereby the refresh frequencies of the two display regions may be differently driven by using the two shift registers and their corresponding frequency control signals SN_ctrl, so that the two display regions of the display panel have different picture refresh frequencies.

It should be noted that the first display region 1000 and the second display region 2000 of the display panel in the embodiments of the present disclosure may be an active display area (AA area) and a camera under panel area (CUP area), respectively, or may be two display regions in one cycle arranged periodically in a column direction. The specific manner of dividing the region is not limited in the embodiments of the present disclosure, and those skilled in the art may set the specific manner of dividing the region according to actual requirements. As can be seen from the above, according to the control of the shift register and the frequency control signal SN_ctrl in the embodiments of the present disclosure, it is possible to make different display regions have different picture refresh frequencies, thereby adapting to the requirements of a region where they are located for picture smoothness or display power consumption.

The shift registers cascaded in the present disclosure is described in the embodiments described above. The output of the second output signal SN_OUT is controlled by the frequency control signal SN_ctrl, so that the preset module in the pixel circuit is controlled, and the data refresh frequency of the pixel circuit and the picture refresh frequency of the display panel are switched and adjusted. On the basis of the above objectives, an embodiment of the present disclosure provides specific structures of various shift registers. The structure and the working process of the various shift registers are described with reference to the accompanying drawings.

Figure 20:
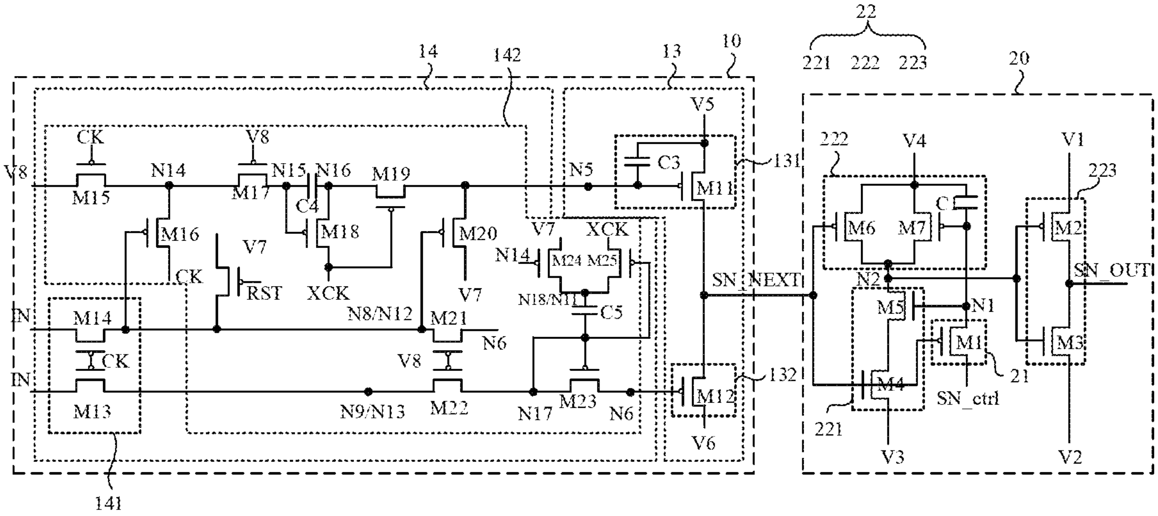
FIG. 20 is a schematic circuit structure diagram of a shift register according to an embodiment of the present disclosure.

FIG. 20 is a schematic circuit structure diagram of a shift register according to an embodiment of the present disclosure. Referring to FIGS. 5 and 20, in an optional embodiment, a second control portion 20 of the shift register includes a first control unit 21 and a second control unit 22. The first control unit 21 is configured to receive at least the first output signal SN_NEXT and the frequency control signal SN_ctrl to control a signal of the first node N1. The second control unit 22 is configured to receive at least the signal of the first node N1 and is configured to control the second output signal SN_OUT.

Here, the first node N1 may be understood as a node controlled by the first control unit 21, and also a node controlling the output of the second control unit 22. Under the control of the first output signal SN_NEXT and the frequency control signal SN_ctrl, a potential of the first node N1 may be changed, and further, a potential signal of the first node N1 may control the second control unit 22 to output different potentials so as to generate the second output signal SN_OUT, so that the second output signal SN_OUT outputs an effective pulse or an ineffective pulse.

Illustratively, when the first output signal SN_NEXT is set to be the ineffective pulse, the first control unit 21 is turned on. When the first output signal SN_NEXT is the effective pulse, the first control unit 21 is turned off. As shown in FIG. 20, the first control unit 21 includes a first transistor M1, and the first transistor M1 is specifically a PMOS-type transistor. In this case, the ineffective pulse of the first output signal SN_NEXT is a low level signal, and the effective pulse of the first output signal SN_NEXT is a high level signal, that is, when the first output signal SN_NEXT is the low level signal, the first transistor M1 in the first control unit 21 is turned on; and when the first output signal SN_NEXT is the high level signal, the first transistor M1 in the first control unit 21 is turned off.

In this case, the first output signal SN_NEXT is substantially a control signal of the first control unit 21, is connected to the control terminal of the first control unit 21, and is configured to control, through the first output signal SN_NEXT, the first control unit 21 to be turned on or off.

Optionally, when the first output signal SN_NEXT and the frequency control signal SN_ctrl are both effective pulses (high level signals), the first control unit 21 is turned off, and the effective pulse of the frequency control signal SN_ctrl is not transmitted to the first node N1.

In this embodiment, the first output signal SN_NEXT is also a control signal of the first control unit 21, and is responsible for controlling the first control unit 21 to be turned on or off. Referring to the first stage t1 of FIG. 7, the first control unit 21 is substantially configured to be in an off state when the first output signal SN_NEXT is the ineffective pulse (high level), thereby blocking the effective pulse of the frequency control signal SN_ctrl from being transmitted to the first node N1.

Optionally, when the first output signal SN_NEXT is the ineffective pulse and the frequency control signal SN_ctrl is the effective pulse, the first control unit 21 is turned on, the effective pulse of the frequency control signal SN_ctrl is transmitted to the first node N1, and the second output signal SN_OUT is the ineffective pulse.

In this case, the first control unit 21 is substantially configured to be in an on state when the first output signal SN_NEXT is an ineffective pulse (low level), and the effective pulse (high level) of the frequency control signal SN_ctrl may be transmitted to the first node N1. Based on this, referring to the second stage t2 of FIG. 7, the second control unit 22 is configured to output an ineffective pulse (low level) when the first node N1 is an effective pulse (high level) of the frequency control signal SN_ctrl. Thus, the second control portion 20 substantially achieves that when the first output signal SN_NEXT is the ineffective pulse (low level) and the frequency control signal SN_ctrl is the effective pulse (high level), the second output signal SN_OUT outputs the ineffective pulse (low level).

Further optionally, when the effective pulse of the frequency control signal SN_ctrl is transmitted to the first node N1, the frequency control signal SN_ctrl is converted from the effective pulse into the ineffective pulse, and the first output signal SN_NEXT remains the effective pulse, the second output signal SN_OUT is the effective pulse (high level).

Referring to the third stage t3 of FIG. 7, at this time, even if the frequency control signal SN_ctrl is converted from the effective pulse to the ineffective pulse (for example, from the high level to the low level), since the first output signal SN_NEXT remains the effective pulse (high level) and the first control unit 21 remains in the off state, no signal of the frequency control signal SN_ctrl is written to the first node N1. In the second stage t2, the frequency control signal SN_ctrl is the effective pulse (exemplified as the high level), and the first node N1 has input the effective pulse of the frequency control signal SN_ctrl, so that the first node N1 remains the effective pulse of the frequency control signal SN_ctrl at the third stage t3, and thus the second control unit 22 may still output the effective pulse (exemplified as the high level) according to the effective pulse signal (exemplified as the high level) of the frequency control signal SN_ctrl of the first node N1, that is, in the third stage t3, the second output signal SN_OUT is the effective pulse (exemplified as the high level).

With continued reference to FIG. 20, exemplarily, the first control unit 21 includes a first transistor M1. A gate of the first transistor M1 is configured to receive a first output signal SN_NEXT, a first electrode of the first transistor M1 is configured to receive the frequency control signal SN_ctrl, and a second electrode of the first transistor M1 is connected to the first node N1.

Here, as shown in FIG. 20, the first transistor M1 may be set to be a PMOS-type transistor, the ineffective pulse of the first output signal SN_NEXT is the low level signal, and the effective pulse of the first output signal SN_NEXT is the high level signal. Apparently, in other embodiments of the present disclosure, the first transistor M1 may be set to be an NMOS-type transistor. At this time, the ineffective pulse of the first output signal is the high level signal, and the effective pulse of the first output signal is the low level signal.

In addition, with continued reference to FIGS. 5 and 20, illustratively, the second control unit 22 is configured to receive at least the first output signal SN_NEXT, the signal of the first node N1, the first voltage signal V1, and the second voltage signal V2, and is configured to control the second output signal SN_OUT. One of the first voltage signal V1 or the second voltage signal V2 is the high level signal VGH, and the other one of the first voltage signal V1 or the second voltage signal V2 is the low level signal VGL.

Here, as described above, the first node N1 is substantially a node controlled by the first control unit 21, and is also a node controlling the output of the second control unit 22. Under the control of the first node N1, the second control unit 22 may selectively output the first voltage signal V1 or the second voltage signal V2 so as to generate the second output signal SN_OUT. It should be understood that since one of the first voltage signal V1 or the second voltage signal V2 is the high level signal VGH and the other one of the first voltage signal V1 or the second voltage signal V2 is the low level signal VGL, the switching of the high level signal and the low level signal of the second output signal SN_OUT, i.e., the switching of the effective pulse and the ineffective pulse, can be achieved by controlling the output of the first voltage signal V1 or the second voltage signal V2.

Optionally, the second control unit 22 includes a first module 221, a second module 222 and a third module 223. The first module 221 is configured to receive a first output signal SN_NEXT, a signal of the first node N1, and a third voltage signal V3 for controlling a signal of the second node N2. The second module 222 is configured to receive the first output signal SN_NEXT, the signal of the first node N1, and the fourth voltage signal V4 for controlling the signal of the second node N2. The third module 223 is configured to receive the first voltage signal SN_NEXT and the second voltage signal V2, and is configured to receive at least the signal of the second node N2 to generate the second output signal SN_OUT. One of the third voltage signal V3 or the fourth voltage signal V4 is the high level signal and the other one of the third voltage signal V3 or the fourth voltage signal V4 is the low level signal.

Figure 21:
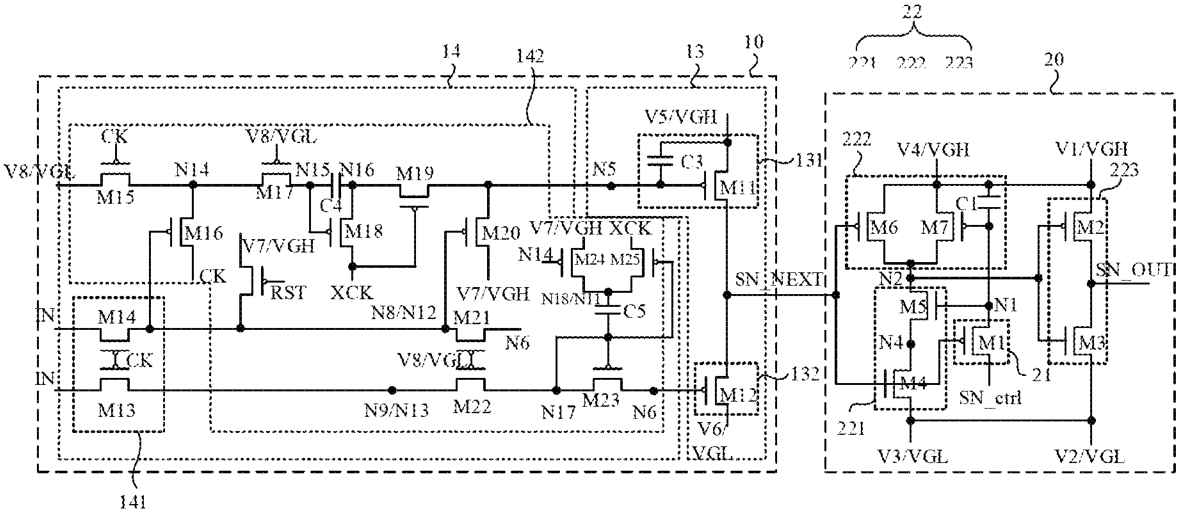
FIG. 21 is a schematic circuit structure diagram of another shift register according to an embodiment of the present disclosure.

FIG. 21 is a schematic circuit structure diagram of another shift register according to an embodiment of the present disclosure. Referring to FIG. 21, further optionally, a high level signal VGH in the first voltage signal V1 and the second voltage signal V2 and a high level signal VGH in the third voltage signal V3 and the fourth voltage signal V4 are signals of a same potential. A low level signal VGL in the first voltage signal V1 and the second voltage signal V2 and a low level signal VGL in the third voltage signal V3 and the fourth voltage signal V4 are signals of a same potential. FIG. 21 illustrates that the first voltage signal V1 and the fourth voltage signal V4 are a same high level signal VGH, and the second voltage signal V2 and the third voltage signal V3 are a same low level signal VGL.

Figure 22:
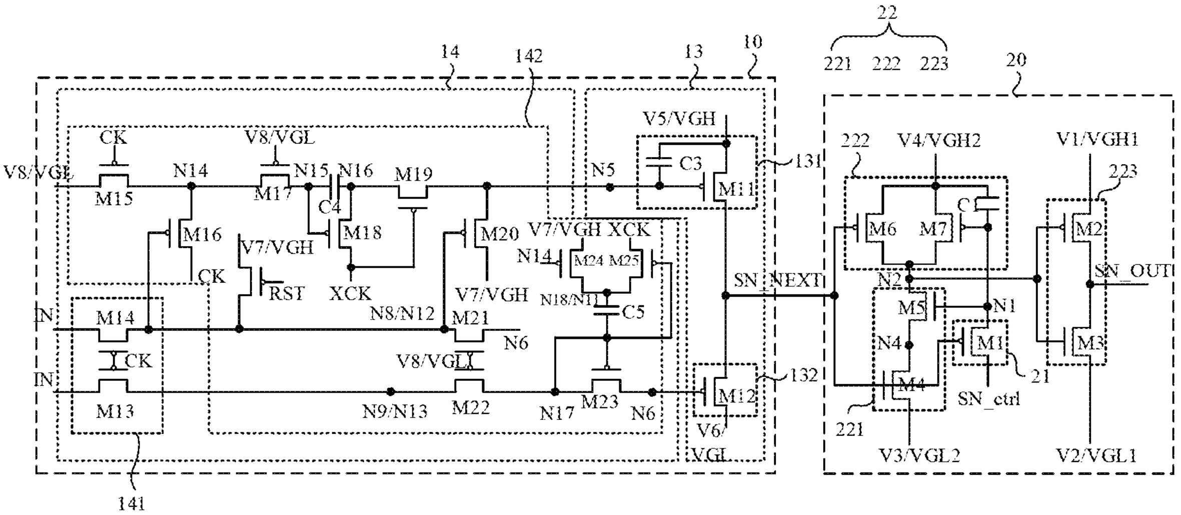
FIG. 22 is a schematic circuit structure diagram of yet another shift register according to an embodiment of the present disclosure.

FIG. 22 is a schematic circuit structure diagram of yet another shift register according to an embodiment of the present disclosure. Referring to FIG. 22, in a specific embodiment, a voltage value of a high level signal VGH in the first voltage signal V1 and the second voltage signal V2 is VGH1 (exemplarily, the first voltage signal V1 is the high level signal VHG1 in the drawings), and a voltage value of a high level signal VGH in the third voltage signal V3 and the fourth voltage signal V4 is VGH2 (exemplarily, the fourth voltage signal V4 is the high level signal VHG2 in the drawings), $VGH1 \neq VGH2$; and/or, a voltage value of a low level signal VGL in the first voltage signal V1 and the second voltage signal V2 is VGL1 (exemplarily, the second voltage signal V2 is the low level signal VGL1 in the drawings), and a voltage value of a low level signal in the third voltage signal V3 and the fourth voltage signal V4 is VGL2 (exemplarily, the third voltage signal V3 is the low level signal VGL2 in the drawings), and $VGL1 \neq VGL2$.

Referring to FIGS. 5 and 22, in this embodiment, the first voltage signal V1 and the second voltage signal V2 are provided to the third module 223, the third voltage signal V3 is provided to the first module 221, and the fourth voltage signal V4 is provided to the second module 222 thereby separately setting high level signals and low level signals required by the first module 221, the second module 222 and the third module 223. Thus, the second output signal SN_OUT is output by the third module 223 and by using the first voltage signal V1 and the second voltage signal V2, so that the voltage of the second output signal SN_OUT may be changed, whereby the required signals can be selectively output according to different requirements of the pixel circuit 200 in the display panel for different signals, and the flexibility of the driver circuit 100 for outputting the signal voltage is improved.

Further optionally, $VGH1 > VGH2$ may be set; and/or $VGL1 < VGL2$ may be set. At this time, it is essentially set that the high level voltage signal VGH1 received by the third module 223 is higher than the high level voltage signal VGH2 received by the first module 221 and the second module 222, and the low level voltage signal VGL1 received by the third module 223 is lower than the low level voltage signal VGL2 received by the first module 221 and the second module 222, so that when the second output signal SN_OUT is output by the second module 222, it is possible to ensure that the transistor therein in the on state can be more tend to work in the saturated state, and the transistor therein in the off state can be better closed, so that the output signal OUT is more stable.

Figure 23:
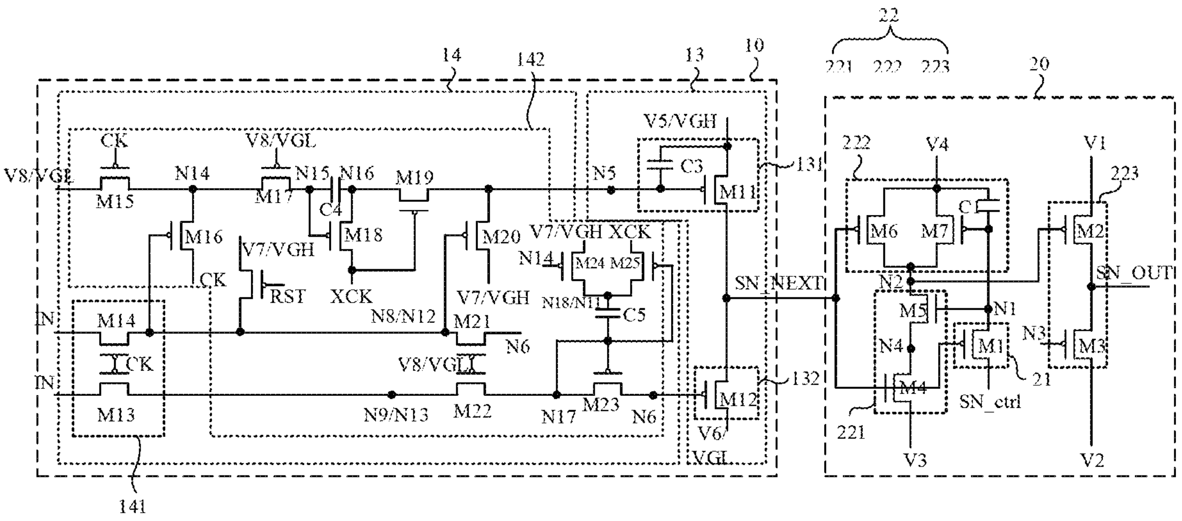
FIG. 23 is a schematic circuit structure diagram of yet another shift register according to an embodiment of the present disclosure.

FIG. 23 is a schematic circuit structure diagram of yet another shift register according to an embodiment of the present disclosure. Referring to FIGS. 20 and 23, illustratively, the third module 223 includes a second transistor M2 and a third transistor M3. A first electrode of the second transistor M2 is configured to receive a first voltage signal V1, a second electrode of the second transistor M2 is configured to output the second output signal SN_OUT, and a gate of the second transistor M2 is connected to the second node N2. A first electrode of the third transistor M3 is configured to receive the second voltage signal V2, a second electrode of the third transistor M3 is configured to output the second output signal SN_OUT, and a gate of the third transistor M3 is connected to the second node N2 (as shown in FIG. 20) or the third node N3 (as shown in FIG. 23).

With the shift register shown in FIG. 20 as an example, in one embodiment of the present disclosure, when the second transistor M2 is the PMOS-type transistor and the third transistor M3 is the NMOS-type transistor, a gate of the second transistor M2 and a gate of the third transistor M3 are both connected to the second node N2. Apparently, in other embodiments, the second transistor M2 may be set to be the PMOS-type transistor, and the third transistor M3 is set to be the PMOS-type transistor, a gate of the second transistor M2 and a gate of the third transistor M3 are both connected to the second node N2.

The shift register shown in FIG. 23 is used as an example, in another embodiment of the present disclosure, when the gate of the third transistor M3 is connected to the third node N3 and the first output signal SN_NEXT is the ineffective pulse, the second output signal SN_OUT output by the third transistor M3 is controlled to be the ineffective pulse by the third node N3.

Further, when the second transistor M2 and the third transistor M3 are PMOS-type transistors, or the second transistor M2 and the third transistor M3 are NMOS-type transistors (as shown in the example shown in FIG. 23, they are PMOS-type transistors), a gate of the second transistor M2 is connected to the second node N2, and a gate of the third transistor M3 is connected to the third node N3. It should be noted that, in the embodiments of the present disclosure, the node in the first control portion 10 is led out as the third node N3, a specific position and a connection relationship of the third node N3 in the first control portion 10 will be described in detail later and are not be explained here.

As shown in FIG. 23, the third transistor M3 is the PMOS-type transistor, a gate of the third transistor M3 is connected to the third node N3 for the turned-on control. The objective thereof is that, since the second output signal SN_OUT is generally in an ineffective pulse, that is, a low level state for a long time, the third transistor M3 needs to be turned on for a long time, and when the third transistor M3 is set to be the NMOS-type transistor, the gate of the third transistor M3 is configured to receive a high level signal for a long time, which causes a threshold drift of the NMOS-type transistor, thereby causing the electrical characteristics of the transistor to become unstable, and causing the abnormality of the on and off. On the contrary, the third transistor M3 is set to be the PMOS-type transistor, the third transistor M3 is turned on when the gate is in a low level, which does not cause the threshold drift problem, so that the offset of the transistor characteristic curve can be avoided, the electrical characteristics of the transistor can be ensured to be stable, and the abnormality of the on and off can be avoided.

With continued reference to FIGS. 20 and 23, optionally, the first module 221 includes a fourth transistor M4 and a fifth transistor T5. A first electrode of the fourth transistor M4 is configured to receive the third voltage signal V3, a second electrode of the fourth transistor M4 is connected to the fourth node N4, and a gate of the fourth transistor M4 is configured to receive the first output signal SN_NEXT, a first electrode of the fifth transistor M5 is connected to the fourth node N4, a second electrode of the fifth transistor M5 is connected to the second node N2, and a gate of the fifth transistor M5 is connected to the first node N1.

Illustratively, when the first transistor T1 is turned on, the fourth transistor T4 is turned off; or when the first transistor M1 is turned off, the fourth transistor M4 is turned on. As shown in FIGS. 20 and 23, the first transistor M1 may be the PMOS-type transistor, and the fourth transistor M4 may be the NMOS-type transistor. Apparently, in other embodiments, the first transistor M1 may be set to be the NMOS-type transistor, and the fourth transistor M4 may be set to be the PMOS-type transistor.

At this time, since a gate of the first transistor M1 and a gate of the fourth transistor M4 are configured to receive the first output signal SN_NEXT, one of the two transistors is controlled to be turned on and the other one of the two transistors is controlled to be turned off according to the first output signal SN_NEXT.

Further, when the first transistor M1 is turned on, the first transistor M1 may input the frequency control signal SN_ctrl to the first node N1, and since the gate of the fifth transistor M5 is connected to the first node N1, the gate of the fifth transistor M5 is controlled by the potential on the first node N1. Based on this, as shown in FIGS. 20 and 23, the effective pulse of the frequency control signal SN_ctrl may be set to be the high level signal, and the fifth transistor M5 is the NMOS-type transistor. Apparently, in other embodiments of the present disclosure, the effective pulse of the frequency control signal SN_ctrl may be set to the low level signal, and the fifth transistor M5 may be the PMOS-type transistor.

It should be added, in the embodiment shown in FIG. 23, the fourth transistor M4 is set to be the PMOS-type transistor, and the objective thereof is that the gate of the fourth transistor M4 is configured to receive the first output signal SN_NEXT. Since the first output signal SN_NEXT is in an ineffective pulse, that is, a low level state for a long time, if the fourth transistor M4 is set to be the NMOS-type transistor, the fourth transistor M4 is turned on for a long time, thereby causing the threshold voltage thereof to drift, which may affect the electrical property of the fourth transistor M4, so that the on and off control of the fourth transistor M4 is not accurate enough. On the contrary, the fourth transistor M4 is set to be the PMOS-type transistor, it is possible to ensure that the fourth transistor M4 is in an off state for a long time under the control of the first output signal SN_NEXT, thereby reducing the possibility of occurrence of threshold drift and ensuring the electrical stability of the first transistor M4.

Still further, the second module 222 in the second control unit 22 of the second control portion 20 may include a sixth transistor M6 and a seventh transistor M7. A first electrode of the sixth transistor M6 is configured to receive the fourth voltage signal V4, a second electrode of the sixth transistor M6 is connected to the second node N2, and a gate of the sixth transistor M6 is configured to receive the first output signal SN_NEXT. A first electrode of the seventh transistor M7 is configured to receive the fourth voltage signal V4, a second electrode of the seventh transistor M7 is connected to the second node N2, and a gate of the seventh transistor M7 is connected to the first node N1.

When the fourth transistor M4 is turned on, the sixth transistor M6 is turned off; or when the fourth transistor M4 is turned off, the sixth transistor M6 is turned on. As shown in FIGS. 20 and 23, the fourth transistor M4 is the NMOS-type transistor, and the sixth transistor M6 is the PMOS-type transistor. Apparently, in other embodiments of the present disclosure, the fourth transistor M4 may be set to be the PMOS-type transistor, and the sixth transistor M6 may be set to be the NMOS-type transistor.

It will also be understood that since a gate of the fourth transistor M4 and a gate of the sixth transistor M6 are configured to receive the first output signal SN_NEXT, the two transistors adopt different types of transistors, one of the two transistors is controlled to be turned on and the other one of the two transistors is controlled to be turned off according to first output signal SN_NEXT. Since the first electrode of the fourth transistor M4 is configured to receive the third voltage signal V3, the first electrode of the sixth transistor M6 is configured to receive the fourth voltage signal V4, one of the third voltage signal V3 or the fourth voltage signal V4 is a high level signal, and the other of the third voltage signal V3 or the fourth voltage signal V4 is a low level signal. When the fourth transistor M4 is turned on, the second node N2 is written into the third voltage signal V3; and when the sixth transistor M6 is turned on, the second node N2 is written into the fourth voltage signal V4. It can be seen that the pulse signal of the first output signal SN_NEXT may control the fourth transistor M4 or the sixth transistor M6 to be turned on, thereby achieving the control of writing the high level signal or low level signal to the second node N2. Further, the second transistor M2 or even the third transistor M3 in the third module 223 may be turned on by the potential of the second node N2, whereby the first voltage signal V1 is output when the second transistor M2 is turned on, and the second voltage signal V2 is output when the third transistor M3 is turned on, so that switching of different levels is achieved, and further switching of the effective pulse and the ineffective pulse is achieved by the output second output signal SN_OUT.

Further, the second module 222 further includes a first capacitor C1, a first plate of the first capacitor C1 is configured to receive the fourth voltage signal V4, and a second plate of the first capacitor C1 is connected to the first node N1. Here, the first capacitor C1 mainly functions to store a potential signal. It should be understood that, when the first transistor M1 is turned on, the frequency control signal SN_ctrl is input to the first node N1, and this process is also a process of charging the first capacitor C1, whereby the potential signal stored by the first capacitor C1 can ensure that the potential of the first node N1 may be maintained for a long time and until the next stage (for example, the third stage t3 in FIG. 7). In this way, even if the frequency control signal SN_ctrl is switched from the effective pulse to the ineffective pulse, the first node N1 may still play a role when the frequency control signal SN_ctrl is the effective pulse within a certain period of time, so that the second output signal SN_OUT outputs the complete effective pulse.

As in FIGS. 20 and 23 described above, in some embodiments, the first voltage signal V1 may be set to the high level signal VGH and the second voltage signal V2 may be set to the low level signal VGL; and/or, the third voltage signal V3 is the low level signal VGL and the fourth voltage signal V4 is the high level signal VGH.

The working process and principle of the second control portion in the shift register will be described with reference to FIGS. 7 and 20. Firstly, it should be noted that the first transistor M1, the second transistor M2, the sixth transistor M6, and the seventh transistor M7 here are PMOS-type transistors that are turned on at the low level. For these transistors, the effective pulse of the signal received at the control terminal thereof is a low level signal, and the ineffective pulse of the signal received at the control terminal thereof is a high level signal. The third transistor M3, the fourth transistor M4, and the fifth transistor M5 are NMOS-type transistors that are turned on at the high level. For these transistors, the effective pulse of the signal received at the control terminal thereof is a high level signal, and the ineffective pulse of the signal received at the control terminal thereof is a low level signal.

At the zero stage to, the first output signal SN_NEXT is in the high level, and the frequency control signal SN_ctrl is switched from the low level to the high level. At this time, the first transistor M1 is turned off, the sixth transistor M6 is turned off, the fourth transistor M4 is turned on, the first node N1 maintains a low level state at the previous stage (the first output signal SN_NEXT is in a low level, and the frequency control signal SN_ctrl is in a low level stage, which is equivalent to the fourth stage t4), the fifth transistor M5 is turned off, the seventh transistor M7 is turned on, the fourth voltage signal V4 (high level signal VGH) is input to the second node N2 through the sixth transistor M6, so that the second node N2 is in a high level state, the second transistor M2 is turned off, the third transistor M3 is turned on, the second voltage signal V2 (low level signal VGL) is output through the third transistor M3, and at this time, the second output signal SN_OUT is the ineffective pulse, that is, the low level.

In the first stage t1, the first output signal SN_NEXT is in a high level, and the frequency control signal SN_ctrl is in a high level. At this time, the first transistor M1 is turned off, the sixth transistor M6 is turned off, the fourth transistor M4 is turned on, and the first capacitor C1 is discharged, so that the potential of the first node N1 remains in the high level state, the fifth transistor M5 is turned on, the seventh transistor M7 is turned off, and the third voltage signal V3 (low level signal VGL) is input to the second node N2 through the fourth transistor M4 and the fifth transistor M5, so that the second node N2 is in the low level state, the second transistor M2 is turned on, the third transistor M3 is turned off, the first voltage signal V1 (high level signal VGH) is output through the second transistor M2, and at this time, the second output signal SN_OUT is the effective pulse, that is, the high level.

In the second stage t2, the first output signal SN_NEXT is in the low level, and the frequency control signal SN_ctrl is in the high level. At this time, the first transistor M1 is turned on, the sixth transistor M6 is turned on, and the fourth transistor M4 is turned off. The frequency control signal SN_ctrl is input to the first node N1 through the first transistor M1 and the first capacitor C1 is charged so that the first node N1 remains in the high level state, the fifth transistor M5 is turned on, the seventh transistor M7 is turned off, the fourth voltage signal V4 (high level signal VGH) is input to the second node N2 through the sixth transistor M6 so that the second node N2 is in the high level state, the second transistor M2 is turned off, the third transistor M3 is turned on, the second voltage signal V2 (low level signal VGL) is output through the third transistor M3, and at this time, the second output signal SN_OUT is the ineffective pulse, that is, the low level.

In the third stage t3, the first output signal SN_NEXT is in a high level, and the frequency control signal SN_ctrl is switched from a high level to a low level. At this time, the first transistor M1 is turned off, the sixth transistor M6 is turned off, the fourth transistor M4 is turned on, the first node N1 continues to remain in the high level state based on the discharging of first capacitor C1, the fifth transistor M5 is turned on, the seventh transistor M7 is turned off, the third voltage signal V3 (the low level signal VGL) is input to the second node N2 through the fourth transistor M4 and the fifth transistor M5, the second node N2 is in the low level state, the second transistor M2 is turned on, the third transistor M3 is turned off, the first voltage signal V1 (the high level signal VGH) is output through the second transistor M2, and at this time, the second output signal SN_OUT is the effective pulse, that is, the high level.

In the fourth stage t4, the first output signal SN_NEXT is in a low level, and the frequency control signal SN_ctrl is in a low level. At this time, the first transistor M1 is turned on, the sixth transistor M6 is turned on, and the fourth transistor M4 is turned off. The frequency control signal is input to the first node N1 through the first transistor M1 and the first capacitor C1 is charged, the first node N1 is in a low level state, the fifth transistor M5 is turned off, the seventh transistor M7 is turned on, the fourth voltage signal V4 (high level signal VGH) is input to the second node N2 through the sixth transistor M6, so that the second node N2 is in a high level state, the second transistor M2 is turned off, the third transistor M3 is turned on, the second voltage signal V2 (low level signal VGL) is output through the third transistor M3, and at this time, the second output signal SN_OUT is the ineffective pulse, that is, the low level.

In the fifth stage t5, the first output signal SN_NEXT is in the high level, and the frequency control signal SN_ctrl is in the low level. At this time, the first transistor M1 is turned off, the sixth transistor M6 is turned off, the fourth transistor M4 is turned on, the first node N1 may continue to remain in the low level state based on the discharging of the first capacitor C1, the fifth transistor M5 is turned off, the seventh transistor M7 is turned on, the fourth voltage signal V4 (the high level signal VGH) is input to the second node N2 through the sixth transistor M6 so that the second node N2 is in the high level state, the second transistor M2 is turned off, the third transistor M3 is turned on, the second voltage signal V2 (the low level signal VGL) is output through the third transistor M3, and at this time, the second output signal SN_OUT is the ineffective pulse, that is, the low level.

The internal structure of the second control portion in the shift register and the working principle of outputting the second output signal according to the first output signal of the first control portion and the frequency control signal are described in the foregoing embodiments. The internal structure of the first control portion and the working principle of controlling the first output signal are described below.

With continued reference to FIGS. 5 and 20, optionally, the first control portion 10 includes a third control unit 13, and the third control unit 13 includes a first output module 131 and a second output module 132. One end of the first output module 131 is configured to receive the fifth voltage signal V5, another end of the first output module 131 is configured to output the first output signal SN_NEXT, and the control terminal of the first output module 131 is connected to the fifth node N5. One end of the second output module 132 is configured to receive the sixth voltage signal V6, another end of the second output module 132 is configured to output the first output signal SN_NEXT, and the control terminal of the second output module 132 is connected to the sixth node N6. One of the fifth voltage signal V5 or the sixth voltage signal V6 is the high level signal and the other of the fifth voltage signal V5 or the sixth voltage signal V6 is the low level signal.

Here, the first output module 131 and the second output module 132 are turned on or off according to the signals of the nodes connected to the control terminals thereof, whereby the fifth voltage signal V5 is output through the first output module 131, or the sixth voltage signal V6 is output through the second output module 132. It should be understood that since one of the fifth voltage signal V5 or the sixth voltage signal V6 is the high level signal, and the other of the fifth voltage signal V5 or the sixth voltage signal V6 is the low level signal, the first output signal SN_NEXT may be switched between the effective pulse and the ineffective pulse by the output control of the third control unit 13 to control the timing of the first output signal SN_NEXT.

Based on the structure of the third control unit 13 described above, in the embodiments of the present disclosure, optionally, the low level signals VGL in the first voltage signal V1 and the second voltage signal V2 and the low level signals VGL in the fifth voltage signal V5 and the sixth voltage signal V6 may be signals of a same potential; and/or the high level signals VGH in the first voltage signal V1 and the second voltage signal V2 and the high level signals VGH in the fifth voltage signal V5 and the sixth voltage signal V6 may be signals of a same potential; and/or the low level signals VGL in the third voltage signal V3 and the fourth voltage signal V4 and the low level signals VGL in the fifth voltage signal V5 and the sixth voltage signal V6 are signals of a same potential; and/or the high level signals VGH in the third voltage signal V3 and the fourth voltage signal V4 and the high level signals VGH in the fifth voltage signal V5 and the sixth voltage signal V6 are signals of a same potential. In FIG. 21, exemplarily, the fifth voltage signal V5, the first voltage signal V1 and the fourth voltage signal V4 are a same high level signal VGH, and the sixth voltage signal V6, the second voltage signal V2 and the third voltage signal V3 are a same low level signal VGL.

According to this embodiment, in essence, at least two high level signals or at least two low level signals are multiplexed, whereby a number of high level signal lines or low level signal lines can be saved, thereby facilitating the arrangement of wires, facilitating the simplification of the circuit structure of the shift register 110, and reducing the complexity of the shift register 110.

Still further, with continued reference to FIG. 23, on the basis of the structure of the third control unit 13 described above, optionally, the third node N3 and the sixth node N6 are the same nodes.

At this time, the gate of the third transistor M3 in the third module 223 of the second control portion 20 is substantially connected to the same node as the control terminal of the first output module 131. Thus, the third module 223 may be driven synchronously with the second output module 132. When the second output module 132 is switched between on and off, the third module 223 also switches between the on state and the off state. Thus, when the second output module 132 outputs the effective pulse or the ineffective pulse, the third module 223 may directly output the effective pulse or the ineffective pulse, thereby facilitating simplification of the control logic of the third module 223 and simplification of the control circuit structure.

Apparently, in other embodiments of the present disclosure, optionally, the third node N3 and the fifth node N5 may be the same node. At this time, when the second output module 132 outputs an effective pulse or an ineffective pulse, the third module 223 may directly output the effective pulse or the ineffective pulse.

It should be added that the control terminal of the third module 223 is connected to the same node as the control terminal of the first output module 131 or the control terminal of the second output module 132, which needs to be set according to the on and off timing of the first output module 131, the on and off timing of the second output module 132 or the on and off timing of the third module 223. It should be understood that, as shown in FIG. 23, since the third module 223 and the second output module 132 need to be switched synchronously, when the two modules are set to be PMOS-type transistors, the control terminals of the two modules may be connected to the same node, i.e., the sixth node N6. Those skilled in the art may also set, according to this, the third module 223 to be the NMOS-type transistor and set the first output module 131 to be the PMOS-type transistor, and then the control terminals thereof may be connected to the same node, i.e., the fifth node N5. Apparently, the types of transistors and the connection manner of the control terminals of the transistors in the three modules described above are all exemplary schemes, and the present disclosure is not limited thereto.

With continued reference to FIGS. 5 and 20, in the embodiments of the present disclosure, the first control portion 10 further includes a fourth control unit 14. The fourth control unit 14 is configured to receive the input signal IN, the third voltage signal V3 and the fourth voltage signal V4, and a first clock signal CK and/or a second clock signal XCK, and control a potential of the fifth node N5 and a potential of the sixth node N6.

Figure 24:
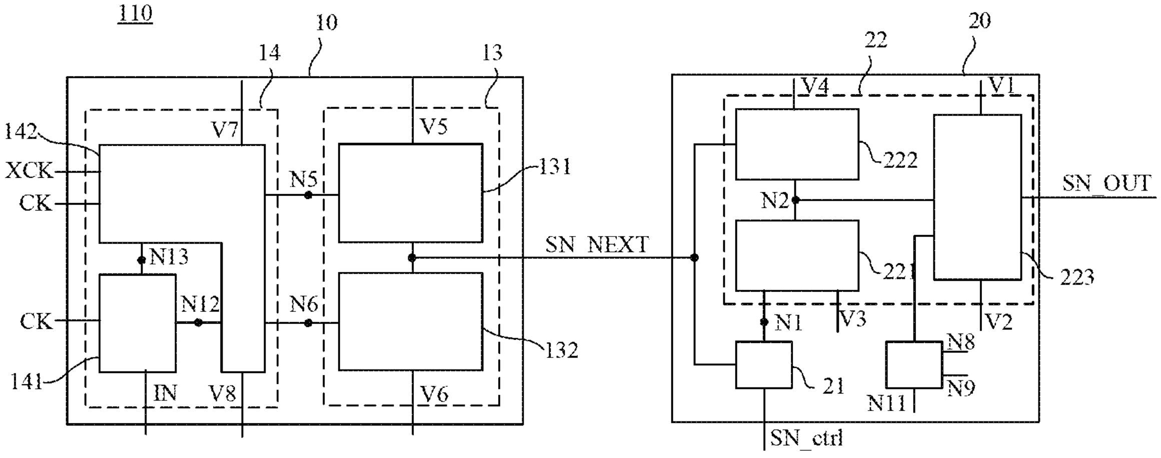
FIG. 24 is a schematic structural diagram of yet another shift register according to an embodiment of the present disclosure.
Figure 25:
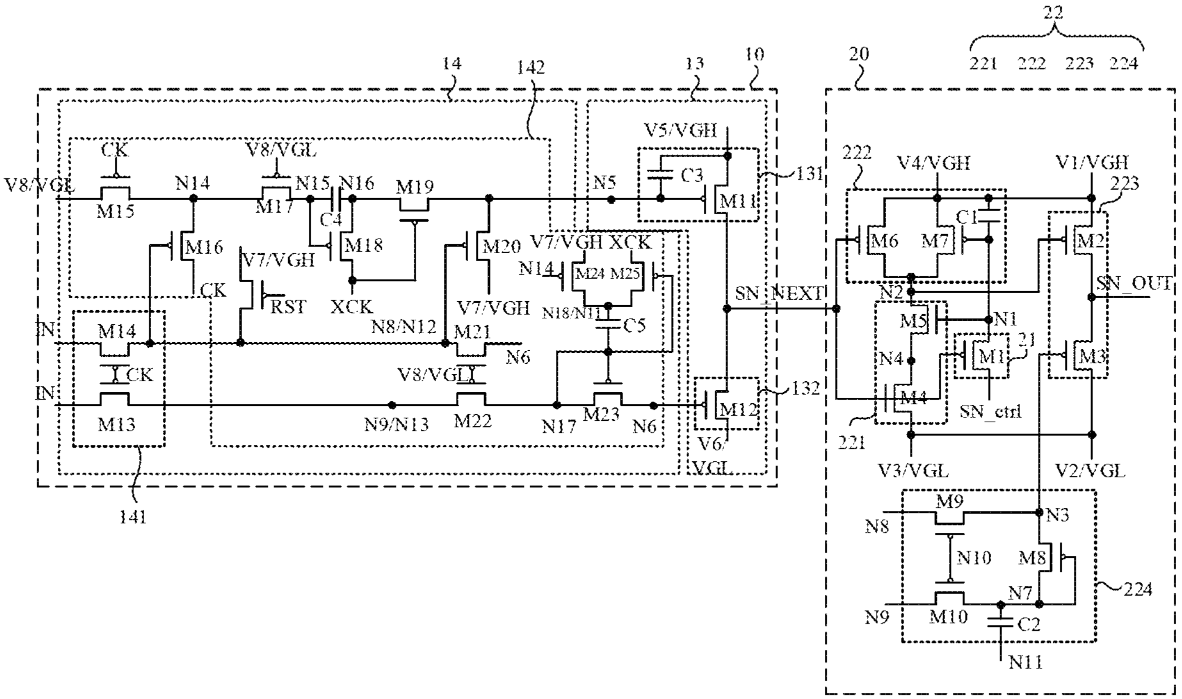
FIG. 25 is schematic circuit structure diagram of the shift register shown in FIG. 24.

Also based on the consideration of sharing the nodes in the first control portion, an embodiment of the present disclosure further provides a structure of a shift register based on the structure of the first control portion. FIG. 24 is a schematic structural diagram of still another shift register according to an embodiment of the present disclosure, and FIG. 25 is schematic circuit structure diagram of the shift register shown in FIG. 24. Referring to FIGS. 24 and 25, in this embodiment, the second control unit 22 of the second control portion 20 further includes a fourth module 224, and the fourth module 224 includes an eighth transistor M8, a ninth transistor M9 and a tenth transistor M10. A first electrode of the eighth transistor M8 is connected to the third node N3, a second electrode of the eighth transistor M8 is connected to the seventh node N7, and a gate of the eighth transistor M8 is connected to the second electrode; A first electrode of the ninth transistor M9 is connected to the eighth node N8, a second electrode of the ninth transistor M9 is connected to the third node N3, and a gate of the ninth transistor M9 is connected to the tenth node N10. A first electrode of the tenth transistor M10 is connected to the ninth node N9, a second electrode of the tenth transistor M10 is connected to the seventh node N7, and a gate of the tenth transistor M10 is connected to the tenth node N10.

Further, with continued reference to FIG. 25, in this embodiment, the fourth module 224 further includes a second capacitor C2, a first plate of the second capacitor C2 is connected to an eleventh node N11, and a second plate of the second capacitor C2 is connected to the seventh node N7.

With continued reference to FIG. 25, for the first output module 131 and the second output module 132 included in the third control unit 13 in the first control section 10, exemplarily, the first output module 131 may include an eleventh transistor M11 and a third capacitor C3, and the second output module 132 may include a twelfth transistor M12. A gate of the eleventh transistor M11 is connected to a fifth node N5, a source of the eleventh transistor M11 is configured to receive a fifth voltage signal V5 (exemplified as a high level signal VGH in the drawings), and a drain of the eleventh transistor M11 is configured to output a first output signal SN_NEXT; a first plate of the third capacitor C3 is configured to receive a fifth voltage signal V5, and a second plate of the third capacitor C3 is connected to the gate of the eleventh transistor M11; a gate of the twelfth transistor M12 is connected to the sixth node N6, a source of the twelfth transistor M12 is configured to receive the sixth voltage signal V6 (exemplified as the low level signal VGL in the drawings), and the drain of the twelfth transistor M12 outputs the first output signal SN_NEXT.

For the fourth control unit 14 in the first control section 10, illustratively, the fourth control unit 14 may include a first control module 141 and a second control module 142. The first control module 141 is configured to receive the input signal IN and control a signal of a twelfth node N12 and a signal of a thirteen node N13 in response to the first clock signal CK, and the twelfth node N12 is connected to the sixth node N6.

The second control module 142 is configured to receive a seventh voltage signal V7 and an eighth voltage signal V8, and control a signal of the fifth node N5 in response to the signal of the twelfth node N12, the signal of the thirteenth node N13, the first clock signal CK, and the second clock signal XCK. One of the seventh voltage signal V7 or the eighth voltage signal V8 is the high level signal, and the other of the seventh voltage signal V7 or the eighth voltage signal V8 is the low level signal.

Exemplarily, the first control module 141 includes a thirteenth transistor M13 and a fourteenth transistor M14. A source of the thirteenth transistor M13 is connected to the input signal IN, a drain of the thirteenth transistor M13 is connected to the twelfth node N12, and a gate of the thirteenth transistor M13 is connected to the first clock signal CK. A source of the fourteenth transistor M14 is connected to the input signal IN, a drain of the fourteenth transistor M14 is connected to the thirteenth node N13, and a gate of the fourteenth transistor M14 is connected to the first clock signal CK.

Exemplarily, the second control module 142 includes a fifteenth transistor M15, a sixteenth transistor M16, a seventeenth transistor M17, an eighteenth transistor M18, a nineteenth transistor M19, a twentieth transistor M20, a twenty-first transistor M21, a twenty-second transistor M22, a twenty-third transistor M23, a twenty-fourth transistor M24, a twenty-fifth transistor M25, a fourth capacitor C4, and a fifth capacitor C5.

A source of the fifteenth transistor M15 is configured to receive the eighth voltage signal V8 (exemplified as a low level signal VGL in the drawings), a gate of the fifteenth transistor M15 is configured to receive the first clock signal CK, and a drain of the fifteenth transistor M15 is connected to a fourteenth node N14; a gate of the sixteenth transistor M16 is connected to the twelfth node N12, a source of the sixteenth transistor M16 is configured to receive the first clock signal CK, and a drain of the sixteenth transistor M16 is connected to the fourteenth node N14; a source of the seventeenth transistor M17 is connected to the fourteenth node N14, a gate of the seventeenth transistor M17 is configured to receive the eighth voltage signal V8, and a drain of the seventeenth transistor M17 is connected to a fifteenth node N15; a source of the eighteenth transistor M18 is configured to receive the second clock signal XCK, a gate of the eighteenth transistor M18 is connected to the fifteenth node N15, and a drain of the eighteenth transistor M18 is connected to a sixteenth node N16; a first plate of the fourth capacitor C4 is connected to the fifteenth node N15, and a second plate of the fourth capacitor C4 is connected to the sixteenth node N16; a source of the nineteenth transistor M19 is connected to the sixteenth node N16, a drain of the nineteenth transistor M19 is connected to the fifth node N5, and a gate of the nineteenth transistor M19 is configured to receive the second clock signal XCK; a source of the twentieth transistor M20 is configured to receive the seventh voltage signal V7 (exemplified as a high level signal VGH in the drawings), a drain of the twentieth transistor M20 is connected to the fifth node N5, and a gate of the twentieth transistor is connected to the twelfth node N12; a source of the twenty-first transistor M21 is connected to the twelfth node N12, a drain of the twenty-first transistor M21 is connected to the sixth node N6, and a gate of the twenty-first transistor M21 is configured to receive the eighth voltage signal V8; a source of the twenty-second transistor M22 is connected to the thirteenth node N13, a drain of the twenty-second transistor M22 is connected to the seventeenth node N17, and a gate of the twenty-second transistor M22 is configured to receive the eighth voltage signal V8; a source and a gate of the twenty-third transistor M23 are connected to the seventeenth node N17, and a drain of the twenty-third transistor M23 is connected to the sixth node N6; a first plate of the fifth capacitor C5 is connected to the seventeenth node N17, and a second plate of the fifth capacitor C5 is connected to the eighteenth node N18; a source of the twenty-fourth transistor M24 is configured to receive the seventh voltage signal V7, a drain of the twenty-fourth transistor M24 is connected to the eighteenth node N18, and a gate of the twenty-fourth transistor M24 is connected to the fourteenth node N14; and a source of the twenty-fifth transistor M25 is configured to receive the second clock signal XCK, a drain of the twenty-fifth transistor M25 is connected to the eighteenth node N18, and a gate of the twenty-fifth transistor M25 is connected to the seventeenth node N17.

A low level signal VGL in the seventh voltage signal V7 and the eighth voltage signal V8 and a low level signal VGL in the fifth voltage signal V5 and the sixth voltage signal V6 are signals of a same potential; and/or a high level signal VGH in the seventh voltage signal V7 and the eighth voltage signal V8 and a high level signal VGH in the fifth voltage signal V5 and the sixth voltage signal V6 are signals of a same potential. As shown in FIG. 25, exemplarily, the seventh voltage signal V7 is the high level signal VGH, and the eighth voltage signal is the low level signal VGL.

With continued reference to FIG. 25, the eighth node N8 and the twelfth node N12 are the same node, the ninth node N9 and the thirteenth node N13 are the same node, and the eleventh node N11 and the eighteenth node N18 are the same node.

At this time, the eighth transistor M8, the ninth transistor M9, the tenth transistor M10, the eleventh transistor M11, and the second capacitor C2 in the fourth module 224 of the second control portion 20 are substantially identical structure with the twenty-first transistor M21, the twenty-second transistor M22, the twenty-third transistor M23, and the fifth capacitor C5 in the first control portion 10. The fourth module 224 in the second control portion 20 is configured to generate a signal completely synchronized with the signal on the sixth node N6 under the control of signals on the twelfth node N12 and the thirteenth node N13, thereby controlling the third transistor M3. It should be understood that the gate of the third transistor M3 (the third node N3) is the same node as the sixth node N6 in embodiment shown in FIG. 23, that is, the gate of the third transistor M3 is connected to the sixth node N6. In the embodiments shown in FIGS. 24 and 25, a control signal synchronized with the signal on the sixth node N6 may be generated by the fourth module 224, so that the fourth module 224 and the twelfth transistor M12 may be controlled synchronously, and the influence of the gate of the twelfth transistor M12, that is, the sixth node N6, may be isolated to some extent, the abnormality of the on and off of the third transistor M3 caused by the instability of the signal on the sixth node N6 is avoided. In this manner, the problem that the gate connected to the third transistor M3 interferes with the on and off of the twelfth transistor M12 is solved, the potential of the gate of the twelfth transistor M12 is stabilized, and thus the abnormality of the on and off of the twelfth transistor M12 is avoided.

Figure 26:
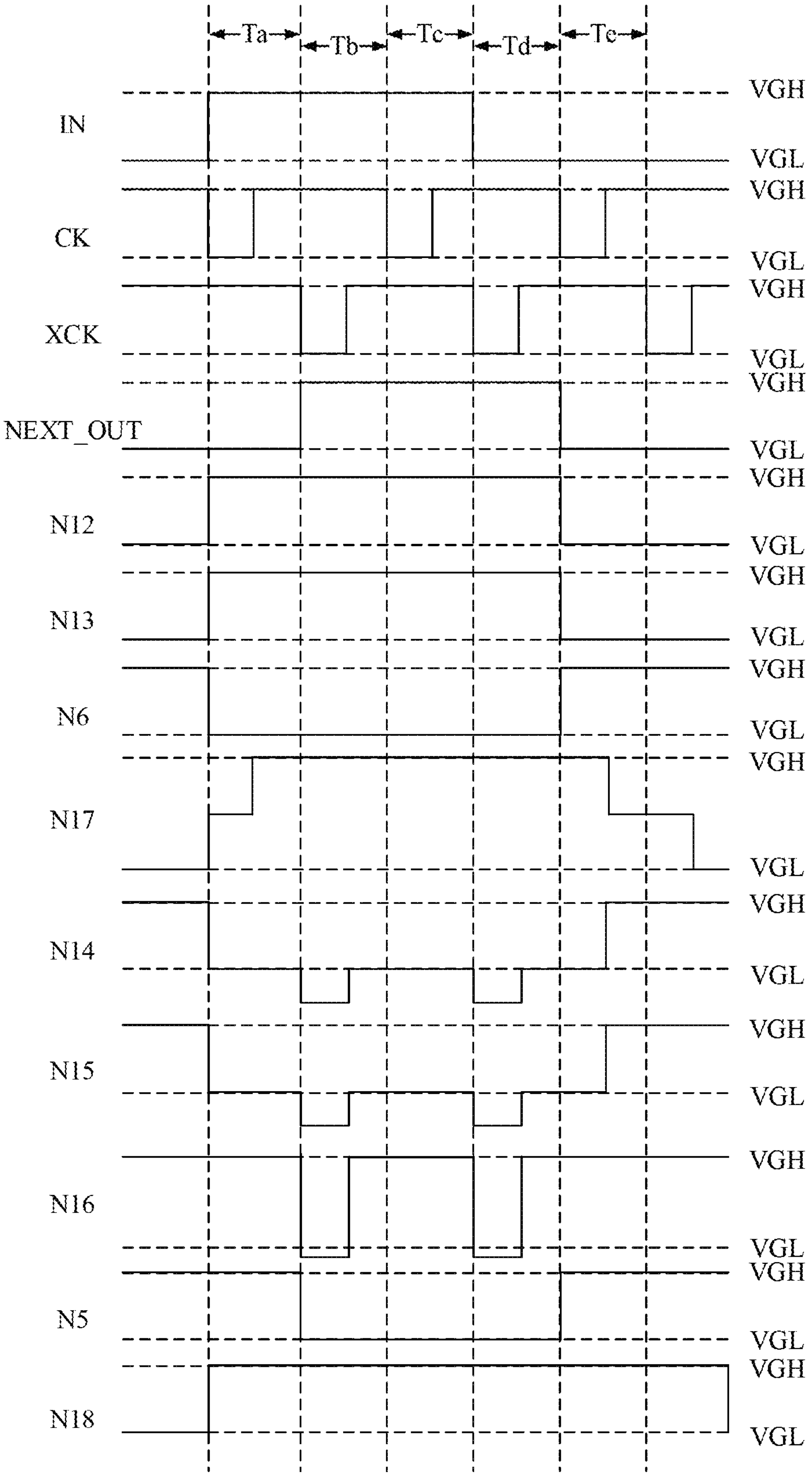
FIG. 26 is a drive timing diagram of a first control portion of the shift register in the embodiment shown in FIG. 25.

FIG. 26 is a drive timing diagram of a first control portion of the shift register in the embodiment shown in FIG. 25. With continued reference to FIGS. 25 and 26, the working principle and the working process of the first control portion of the shift register in the embodiment will be described as follows.

In the Ta stage, the input signal IN is in the high level, and the first clock signal CK is in the low level. At this time, the thirteenth transistor M13, the fourteenth transistor M14, and the fifteenth transistor M15 are turned on, and the input signal IN is transmitted to the twelfth node N12 and the thirteenth node N13 through the thirteenth transistor M13 and the fourteenth transistor M14, respectively, so that the twelfth node N12 and the thirteenth node N13 are both in the high level, and the sixteenth transistor M16 and the twentieth transistor M20 are turned off. Meanwhile, the eighth voltage signal V8 (low level signal VGL) is transmitted to the fourteenth node N14 through the fifteenth transistor M15, the fourteenth node N14 is in the low level, and the seventeenth transistor M17 is normally turned on, so the fifteenth node N15 is in the low level, the eighteenth transistor M18 is turned on. The second clock signal XCK is in the high level, the sixteenth node N16 is kept in the high level, the nineteenth transistor M19 is turned off, the fifth node N5 is kept in the low level, the eleventh transistor M11 is turned on, and the fifth voltage signal V5 (high level signal VGH) is transmitted to the output terminal so that the first output signal SN_NEXT is in the high level.

In the Tb stage, the input signal IN is in the high level, and the first clock signal CK is in the high level. At this time, the thirteenth transistor M13, the fourteenth transistor M14 and the fifteenth transistor M15 are turned off, the twelfth node N12 and the thirteenth node N13 are kept in the high level, the sixteenth transistor M16 and the twentieth transistor M20 are turned off, the fourteenth node N14 is kept in the low level, the eighteenth transistor M18 is turned on. The second clock signal XCK is in the low level and is transmitted to the sixteenth node N16 through the eighteenth transistor M18, so that the sixteenth node N16 is in the low level the eighteenth transistor M18 is turned on. The signal of the sixteenth node N16 is transmitted to the fifth node N5, so that the fifth node N5 is in the low level, the eleventh transistor M11 is turned on, and the fifth voltage signal V5 (high level signal VGH) is transmitted to the output terminal, so that the first output signal SN_NEXT is in the high level.

In the Tc stage, the input signal IN is in the high level, and the first clock signal CK is in the low level. At this time, the thirteenth transistor M13, the fourteenth transistor M14 and the fifteenth transistor M15 are turned on, and the input signal IN is transmitted to the twelfth node N12 and the thirteenth node N13 through the thirteenth transistor M13 and the fourteenth transistor M14, respectively, so that the twelfth node N12 and the thirteenth node N13 are both in the high level, and the sixteenth transistor M16 and the twentieth transistor M20 are turned off. Meanwhile, the eighth voltage signal V8 (low level signal VGL) is transmitted to the fourteenth node N14 through the fifteenth transistor M15, the fourteenth node N14 is in the low level, and the seventeenth transistor M17 is normally turned on, the fifteenth node N15 is in the low level, the eighteenth transistor M18 is turned on, the second clock signal XCK is in the high level, the sixteenth node N16 is kept in the high level, the nineteenth transistor M19 is turned off, the fifth node N5 is kept in the low level, the eleventh transistor M11 is turned on, and the fifth voltage signal V5 (high level signal VGH) is transmitted to the output terminal so that the first output signal SN_NEXT is in the high level.

In the Td stage, the input signal IN is in the low level, the first clock signal CK is in the high level, the thirteenth transistor M13, the fourteenth transistor M14 and the fifteenth transistor M15 are all turned off, the twelfth node N12 and the thirteenth node N13 are all kept high, and the sixteenth transistor M16 and the twentieth transistor M20 are both turned off. The fourteenth node N14 is kept in the low level, and the seventeenth transistor M17 is normally turned on, then the fifteenth node N15 is in the low level, the eighteenth transistor M18 is turned on. The second clock signal XCK is in the low level, and the second clock signal XCK is transmitted to the sixteenth node N16 through the eighteenth transistor M18, so that the sixteenth node N16 is in the low level. Moreover, the nineteenth transistor M19 is turned on, the signal of the sixteenth node N16 is transmitted to the fifth node N5 and is in the low level, the eleventh transistor M11 is turned on, and the fifth voltage signal V5 (high level signal VGH) is transmitted to the output terminal so that the first output signal SN_NEXT is in the high level.

In the Te stage, the input signal IN is in the low level, the first clock signal CK is in the low level, the thirteenth transistor M13, the fourteenth transistor M14 and the fifteenth transistor M15 are turned on, and the input signal IN is transmitted to the twelfth node N12 and the thirteenth node N13 through the thirteenth transistor M13 and the fourteenth transistor M14, respectively, so that the twelfth node N12 and the thirteenth node N13 are both in the low level, and the sixteenth transistor M16 and the twentieth transistor M21 are turned on. Moreover, the fifteenth transistor M15 is turned on, the eighth voltage signal V8 (low level signal VGL) is transmitted to the fourteenth node N14 through the fifteenth transistor M15, the fourteenth node N14 is in the low level, and the seventeenth transistor SN_NEXT is normally turned on, then the fifteenth node N15 is in the low level, the eighteenth transistor M22 is turned on. The second clock signal XCK is in the high level, the sixteenth node N16 is kept in the high level, and the nineteenth transistor M19 is turned off; the twentieth transistor M21 is turned on, and the seventh voltage signal V7 (high level signal VGH) is transmitted to the fifth node N5 through the twentieth transistor M20 so that the fifth node N5 is in the high level, and the eleventh transistor M11 is turned off. Moreover, the twenty-first transistor M21 and the twenty-second transistor M22 are normally turned on, the signal of the twelfth node N12 is transmitted to the sixth node N6 so that the sixth node N6 is in the low level, the twelfth transistor M12 is turned on, and the sixth voltage signal V6 (low level signal VGL) is transmitted to the output terminal so that the first output signal SN_NEXT is in the low level.

It should be added that since the fourth module 224 in the second control portion 20 is obtained by copying the twenty-first transistor M21, the twenty-second transistor M22, the twenty-third transistor M23 and the fifth capacitor C5, the third node N3 output by the second control portion 20 is substantially a synchronization signal with the sixth node N6, whereby the sixth node N6 and the third node N3 are high level signals in the Ta stage to Td stage described above, and the sixth node N6 and the third node N3 are substantially low level signals in the Te stage. Thus, the third transistor M3 is turned off in the Ta stage to Td stage, is turned on in the Te stage, and is configured to output the second voltage signal V2 (low level signal VGL), and the second output signal SN_OUT is in the low level signal in the Te stage.

Figure 27:
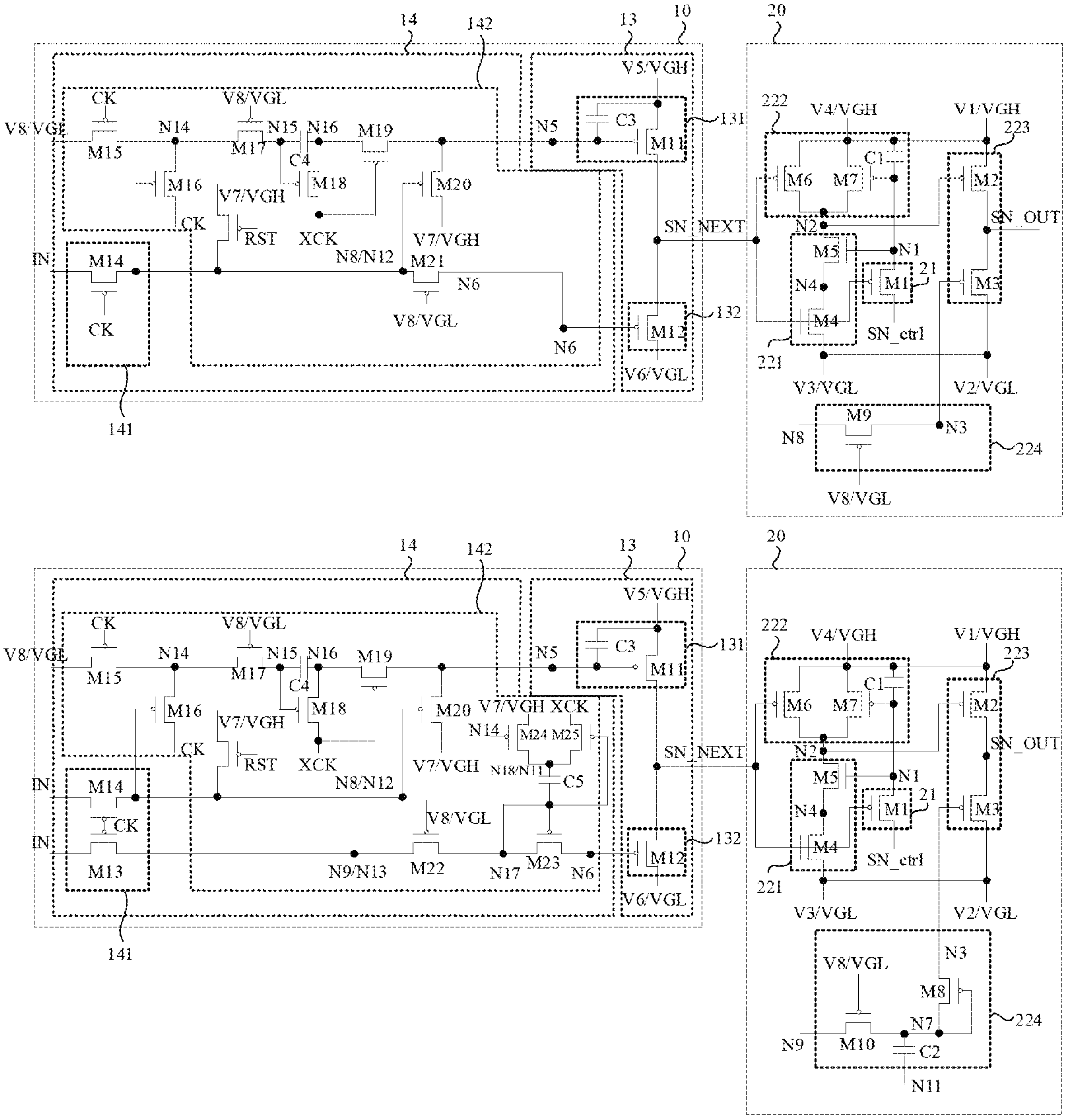
FIGS. 27 and 28 are two other schematic circuit structure diagrams of the shift register shown in FIG. 24.
Figure 28:
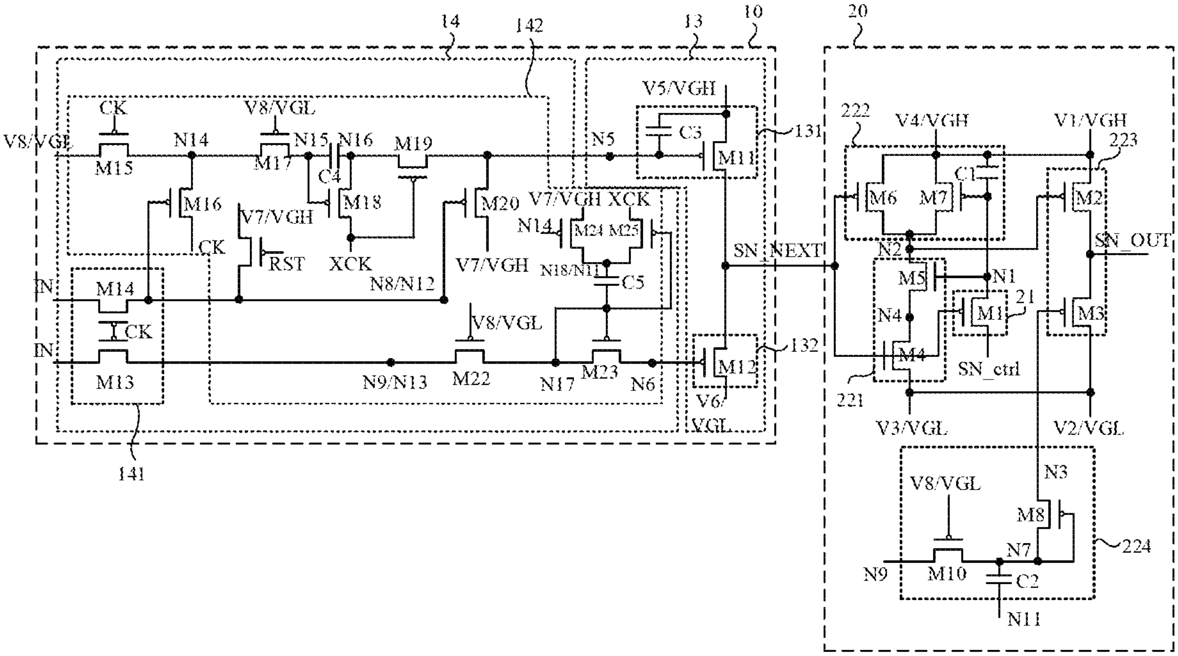

FIGS. 27 and 28 are two other schematic circuit structure diagrams of the shift register shown in FIG. 24. As can be seen from a comparison of FIG. 25 with FIGS. 27 and 28, in other embodiments of the present disclosure, the thirteenth transistor M13, the fourteenth transistor M14, the twenty-first transistor M21, the twenty-second transistor M22, the twenty-third transistor M23, the twenty-fourth transistor M24, the twenty-fifth transistor M25 and the fifth capacitor C5 as shown in FIG. 25 may be selectively set. Compared with the shift register circuit shown in FIG. 25, as shown in FIG. 27, only the fourteenth transistor M14, the twenty-first transistor M21 are disposed, and the thirteenth transistor M13, the twenty-second transistor M22, the twenty-third transistor M23, the twenty-fourth transistor M24, the twenty-fifth transistor M25, and the fifth capacitor C5 may be deleted. At this time, only the ninth transistor M9 may be disposed in the fourth module 224 corresponding to the second control portion 20. As shown in FIG. 28, only the thirteenth transistor M13, the fourteenth transistor M14, the twenty-second transistor M22, the twenty-third transistor M23, the twenty-fourth transistor M24, the twenty-fifth transistor M25 and the fifth capacitor C5 may be provided, and the twenty-first transistor M21 may be deleted. At this time, correspondingly, only the eighth transistor M8, the tenth transistor M10, and the second capacitor C2 may be disposed in the fourth module 224 of the second control portion 20. Based on the same principle, the fourth module 224 shown in FIGS. 27 and 28 may both generate a control signal synchronized with the signal on the sixth node N6 through the nodes in the first control portion 10, thereby controlling the third transistor M3, and meanwhile, isolating the influence of the potential on the sixth node N6, thereby avoiding the abnormality of the on and off of the twelfth transistor M12. In addition, it should be noted that the circuit structure of the first control portion 10 in the embodiments shown in FIGS. 27 and 28 is also applicable to the shift register circuit shown in FIGS. 20 to 23, and is not shown in the drawings.

In addition, it also should be noted that each transistor in the first control section 10 shown in FIGS. 20 to 23, FIG. 25, FIG. 27, and FIG. 28 is exemplified as the PMOS-type transistor, and those skilled in the art may vary the type of the transistor according to actual requirements, for example, the NMOS-type transistor is adopted, which is not limited herein. Moreover, the circuit structure of the first control portion 10 shown in FIGS. 20 to 23, FIG. 25, FIG. 27 and FIG. 28 is only a part of the embodiments of the present disclosure, and those skilled in the art may also replace the first control unit with other circuit structures according to actual requirements, which do not affect the core scheme of the present disclosure, and reasonable modifications made based on the shown embodiments of the present disclosure also fall within the scope of protection of the present disclosure.

Figure 29:
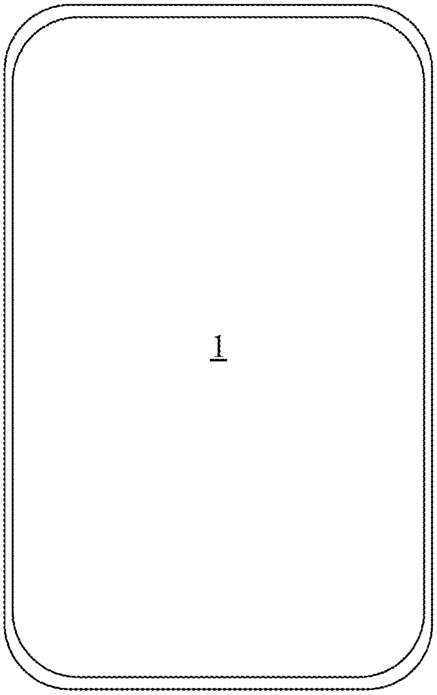
FIG. 29 is a schematic structural diagram of a display device according to an embodiment of the present disclosure.

Based on the same inventive concept, an embodiment of the present disclosure further provides a display device. FIG. 29 is a schematic structural diagram of a display device according to an embodiment of the present disclosure, and referring to FIG. 29, the display device includes the display panel 1 provided in any one of the embodiments of the present disclosure, therefore the display device provided in the embodiments of the present disclosure has the corresponding beneficial effects of the display panel provided in the embodiments of the present disclosure, and details are not repeated here. Exemplarily, the display device may be an electronic apparatus such as a mobile phone, a computer, a smart wearable apparatus (such as, a smart watch), and an on-vehicle display apparatus, which is not limited in this embodiment of the present disclosure.

It should be noted that the above are merely preferred embodiments of the present disclosure and the technical principles applied herein. It should be understood by those skilled in the art that the present disclosure is not limited to the particular embodiments described herein. For those skilled in the art, various apparent modifications, adaptations, combinations and substitutions may be made without departing from the scope of the present disclosure. Therefore, although the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A display panel, comprising:

a driver circuit, comprising shift registers with N stages and being cascaded with each other, wherein N≥2;

wherein a shift register of the shift registers comprises a first control portion and a second control portion;

the first control portion is configured to control a first output signal, wherein the first output signal of an i-th stage of shift register of the shift registers is an input signal of a j-th stage of shift register of the shift registers, and 1≤i≤N, 1≤j≤N;

the second control portion is configured to at least receive the first output signal and a frequency control signal, and control a second output signal; and in a case where the first output signal is an effective pulse and a time period of the effective pulse of the first output signal is within a time period of an effective pulse of the frequency control signal, the second output signal is an effective pulse.

2. The display panel of claim 1, wherein, in a case where at least part of the first output signal is an effective pulse and the time period of the effective pulse partially overlaps with the time period of the effective pulse of the frequency control signal, the second output signal is an ineffective pulse.

3. The display panel of claim 1, wherein, in a case where the frequency control signal is switched from an ineffective pulse to an effective pulse and the first output signal is an effective pulse, the second output signal is an ineffective pulse; and in a case where the frequency control signal is switched from an effective pulse to an ineffective pulse and the first output signal is an effective pulse, the second output signal is an effective pulse.

4. The display panel of claim 1, wherein, a time length of the effective pulse of the first output signal is W1, and a time length of the effective pulse of the frequency control signal is Wc;

a time length that a preset effective pulse of the first output signal overlaps with the effective pulse of the frequency control signal is W0, wherein 0<W0<W1; and in a case where the first output signal is the preset effective pulse, the second output signal is the ineffective pulse.

5. The display panel of claim 1, wherein, in a case where the first output signal is the effective pulse and the time period of the effective pulse is outside the time period of the effective pulse of the frequency control signal, the second output signal is an ineffective pulse.

6. The display panel of claim 1, wherein, in a case where the time period of the effective pulse of the first output signal is within the time period of the effective pulse of the frequency control signal, a time length of the effective pulse of the first output signal is W1, and a time length of the effective pulse of the second output signal is W2, wherein W1=W2.

7. The display panel of claim 1, wherein, a pulse variation frequency of the first output signal is F1, and a pulse variation frequency of the second output signal is F2, wherein F1≥F2.

8. The display panel of claim 7, wherein, in a case where the time period of the effective pulse of the first output signal is within the time period of the effective pulse of the frequency control signal, F1=F2; and in a case where the time period of the effective pulse of the first output signal partially overlaps with the time period of the effective pulse of the frequency control signal, or in a case where the time period of the effective pulse of the first output signal is outside the time period of the effective pulse of the frequency control signal, F1>F2.

9. The display panel of claim 1, wherein, within at least a part of time periods that the display panel works, the first output signal is the effective pulse, the second output signal is the effective pulse.

10. The display panel of claim 1, wherein, within at least a part of time periods that the display panel works, the first output signal is the effective pulse and the second output signal is an ineffective pulse.

11. The display panel of claim 1, wherein, the display panel comprises a pixel circuit, and the second output signal of the driver circuit is a control signal of a preset module of the pixel circuit;

in a case where the second output signal is the effective pulse, the preset module is turned on; and in a case where the second output signal is an ineffective pulse, the preset module is turned off.

12. The display panel of claim 11, wherein, the preset module comprises a p-channel metal oxide semiconductor P-type transistor, and the second output signal is a control signal of the P-type transistor, wherein in a case where the second output signal is a low level signal, the second output signal is the effective pulse to control the P-type transistor to be turned on; or the preset module comprises an N-channel metal oxide semiconductor N-type transistor, and the second output signal is a control signal of the N-type transistor, wherein in a case where the second output signal is a high level signal, the second output signal is the effective pulse to control the N-type transistor to be turned on.

13. The display panel of claim 11, wherein, a working process of the display panel comprises a first mode and a second mode, wherein at least one aspect of following aspects is satisfied, in the first mode, a pulse variation frequency of the frequency control signal is Fc1, and in the second mode, a pulse variation frequency of the frequency control signal is Fc2, wherein Fc1≠Fc2; or in the first mode, a time length of the effective pulse of the frequency control signal is Wc1, and in the second mode, a time length of the effective pulse of the frequency control signal is Wc2, wherein Wc1≠Wc2.

14. The display panel of claim 13, wherein, in the first mode, a pulse variation frequency of the second output signal is Fs1, and in the second mode, a pulse variation frequency of the second output signal is Fs2, wherein Fs1≠Fs2.

15. The display panel of claim 14, wherein at least one aspect of following aspects is satisfied, $$(Fc1-Fc2)\times(Fs1-Fs2)>0;$$

or $$(Wc1-Wc2)\times(Fs1-Fs2)>0.$$

16. The display panel of claim 14, wherein, a working process of the pixel circuit comprises a data write frame and a retention frame, wherein, in the data write frame, the preset module is turned on; and in the retention frame, the preset module is turned off.

17. The display panel of claim 16, wherein, in the first mode, a data refresh frequency of the pixel circuit is Fp1; and in the second mode, a data refresh frequency of the pixel circuit is Fp2;

wherein Fp1≠Fp2.

18. The display panel of claim 17, wherein, $$(Fp1-Fp2)\times(Fs1-Fs2)>0.$$

19. The display panel of claim 1, wherein, the display panel comprises a first pixel circuit and a second pixel circuit, and the driver circuit comprises a first shift register and a second shift register;

the second output signal of the first shift register is a control signal of a first preset module of the first pixel circuit, and the second output signal of the second shift register is a control signal of a second preset module of the second pixel circuit, wherein at least one aspect of following aspects is satisfied;

a pulse variation frequency of the frequency control signal received by the first shift register is Fc11, and a pulse variation frequency of the frequency control signal received by the second shift register is Fc22, wherein Fc11≠Fc22; or a time length of an effective pulse of the frequency control signal received by the first shift register is Wc11, and a time length of an effective pulse of the frequency control signal received by the second shift register is Wc22, wherein Wc11≠Wc22.

20. A display device, comprising the display panel of claim 1.

* * * * *